US011088114B2

United States Patent
Fay et al.

(10) Patent No.: US 11,088,114 B2
(45) Date of Patent: Aug. 10, 2021

(54) HIGH DENSITY PILLAR INTERCONNECT CONVERSION WITH STACK TO SUBSTRATE CONNECTION

(71) Applicant: Micron Technology, Inc., Boise, ID (US)

(72) Inventors: Owen R. Fay, Meridian, ID (US); Kyle K. Kirby, Eagle, ID (US); Akshay N. Singh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/671,546

(22) Filed: Nov. 1, 2019

(65) Prior Publication Data
US 2021/0134759 A1   May 6, 2021

(51) Int. Cl.
| | |
|---|---|
| *H01L 25/065* | (2006.01) |
| *H01L 23/498* | (2006.01) |
| *H01L 23/31* | (2006.01) |
| *H01L 21/56* | (2006.01) |
| *H01L 21/60* | (2006.01) |

(52) U.S. Cl.
CPC ........ *H01L 25/0657* (2013.01); *H01L 21/563* (2013.01); *H01L 23/3114* (2013.01); *H01L 23/49827* (2013.01); *H01L 2021/60037* (2013.01)

(58) Field of Classification Search
CPC ............. H01L 25/0657; H01L 23/3114; H01L 23/49827
See application file for complete search history.

(56) References Cited

U.S. PATENT DOCUMENTS

| | | | |
|---|---|---|---|
| 9,324,626 B2 | 4/2016 | Shen et al. | |
| 10,529,592 B2 | 1/2020 | Fay et al. | |
| 10,833,301 B2 | 11/2020 | Collins et al. | |
| 2011/0049695 A1 | 3/2011 | Shin et al. | |
| 2012/0106117 A1* | 5/2012 | Sundaram | H01L 25/18 361/808 |
| 2012/0298410 A1* | 11/2012 | Lu | H01L 23/49827 174/264 |

(Continued)

OTHER PUBLICATIONS

Fay, O. et al., Unpublished U.S. Patent Application,titled "High Density Pillar Interconnect Conversion With Stack to Substrate Connection", filed Nov. 1, 2019, 37 pages.

(Continued)

*Primary Examiner* — Peniel M Gumedzoe
(74) *Attorney, Agent, or Firm* — Perkins Coie LLP

(57) ABSTRACT

A semiconductor device assembly can include a first semiconductor device and an interposer. The interposer can include a substrate and through vias in which individual vias include an exposed portion and an embedded portion, the exposed portions projecting from one or both of the first surface and the second surface of the substrate, and the embedded portions extending through at least a portion of the substrate. The interposer can include one or more test pads, a first electrical contact, and a second electrical contact. The semiconductor device assembly can include a controller positioned on an opposite side of the interposer from the first semiconductor device and operably coupled to the interposer via connection to the second electrical contact.

15 Claims, 15 Drawing Sheets

(56) References Cited

U.S. PATENT DOCUMENTS

| | | |
|---|---|---|
| 2014/0077369 A1 | 3/2014 | Liang et al. |
| 2015/0061101 A1 | 3/2015 | Le et al. |
| 2015/0262972 A1* | 9/2015 | Katkar .................. H01L 25/50 257/48 |
| 2017/0346097 A1 | 11/2017 | Andry et al. |
| 2019/0172725 A1 | 6/2019 | Fay et al. |
| 2019/0206766 A1 | 7/2019 | Chandolu et al. |

OTHER PUBLICATIONS

Kirby, K. et al., Unpublished U.S. Patent Application, titled "Encapsulated Solder TSV Insertion Interconnect", filed Nov. 1, 2019, 38 pages.

* cited by examiner

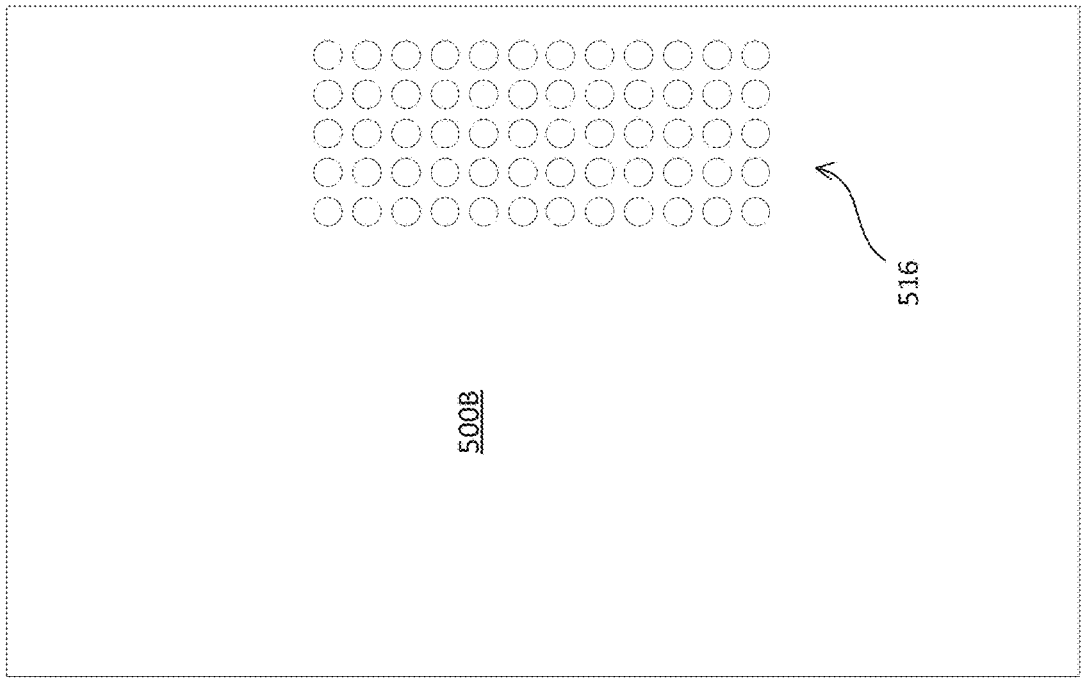
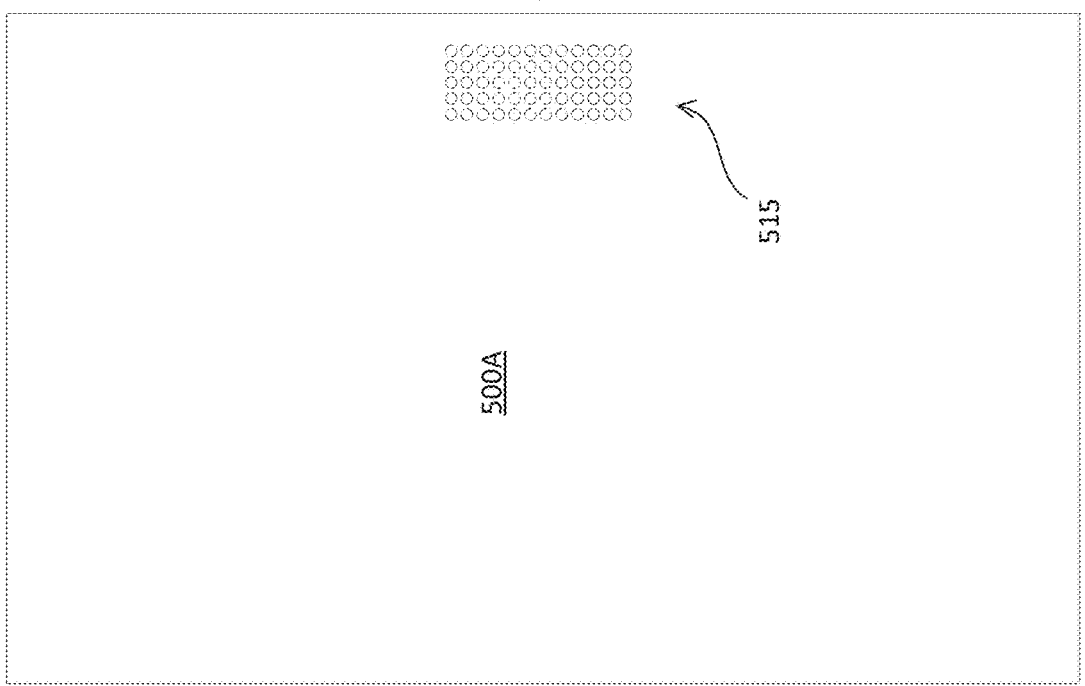
FIG. 10A

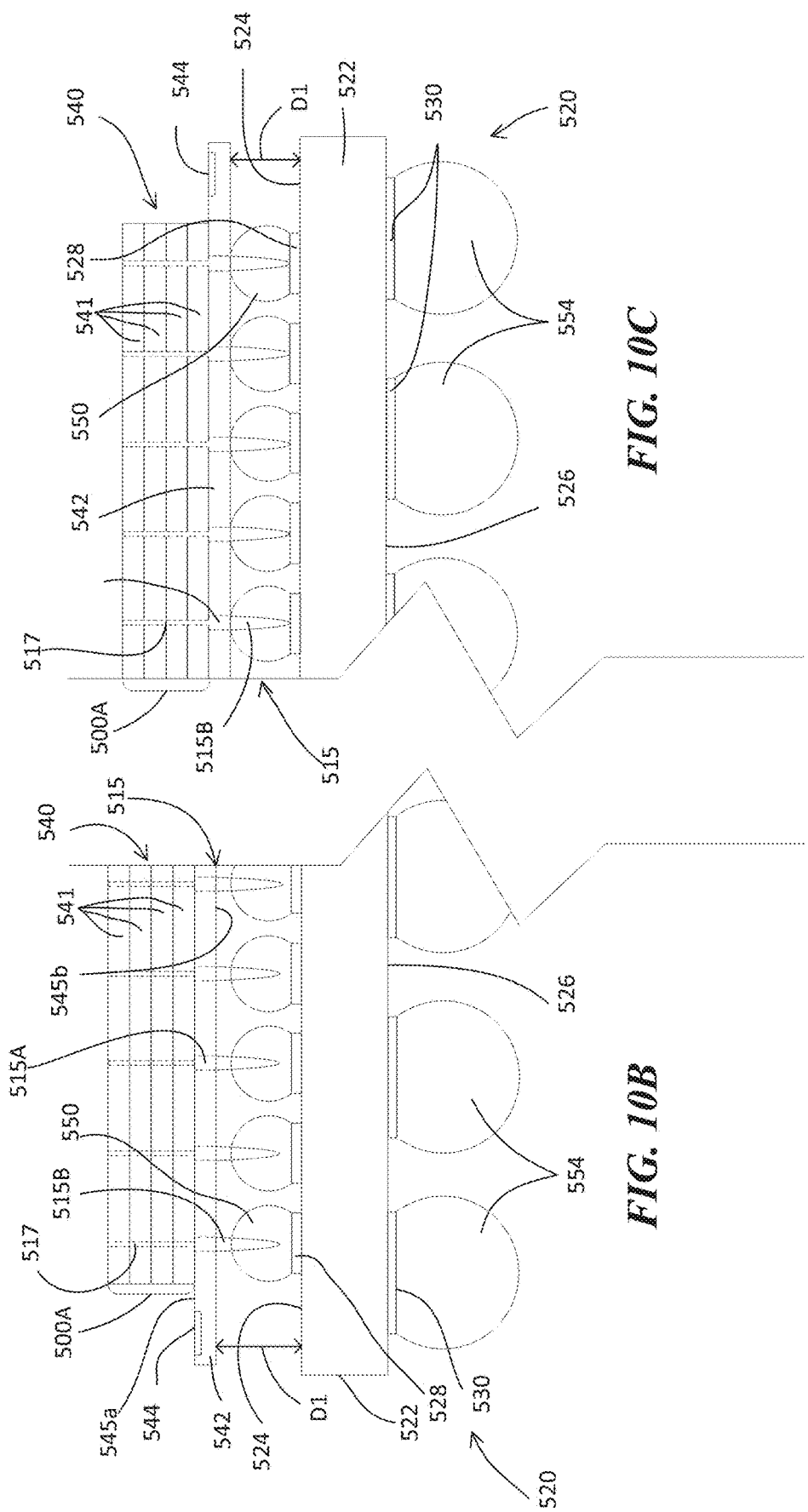

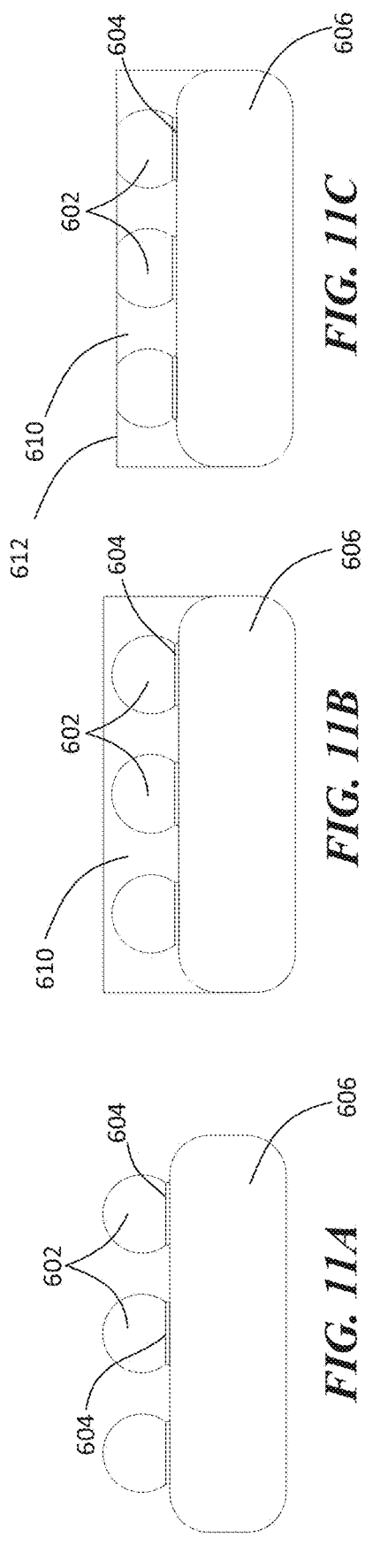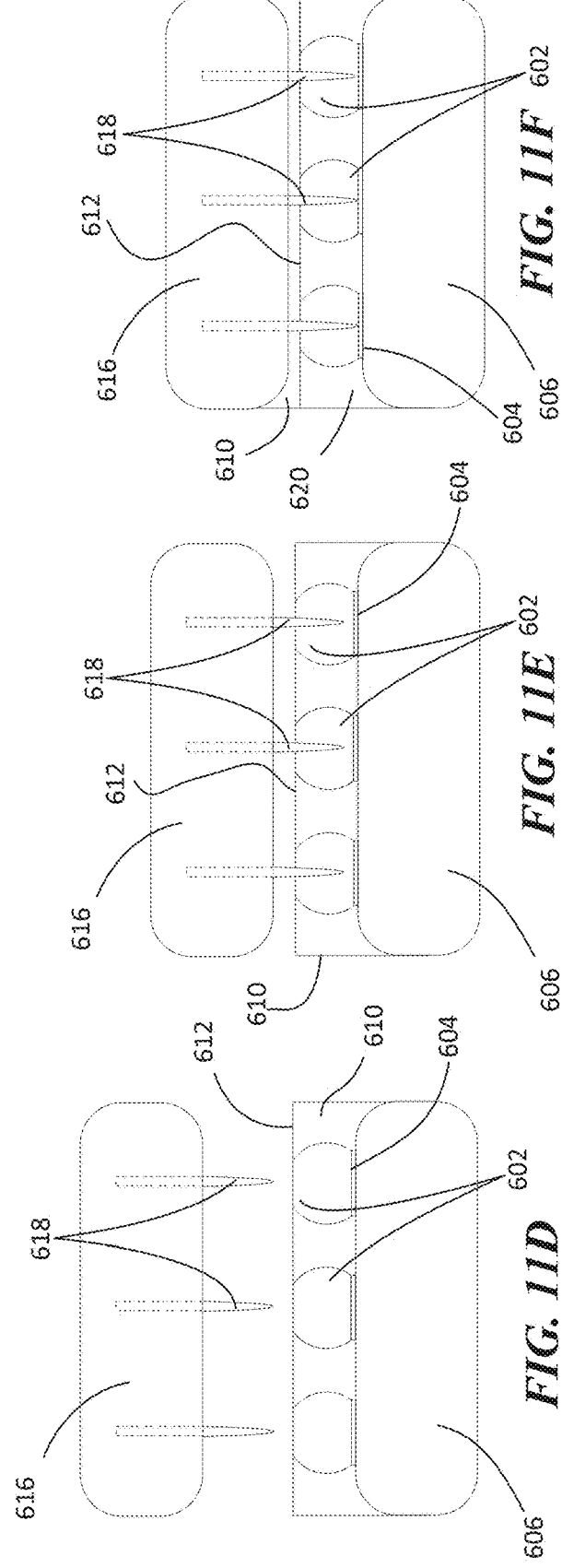

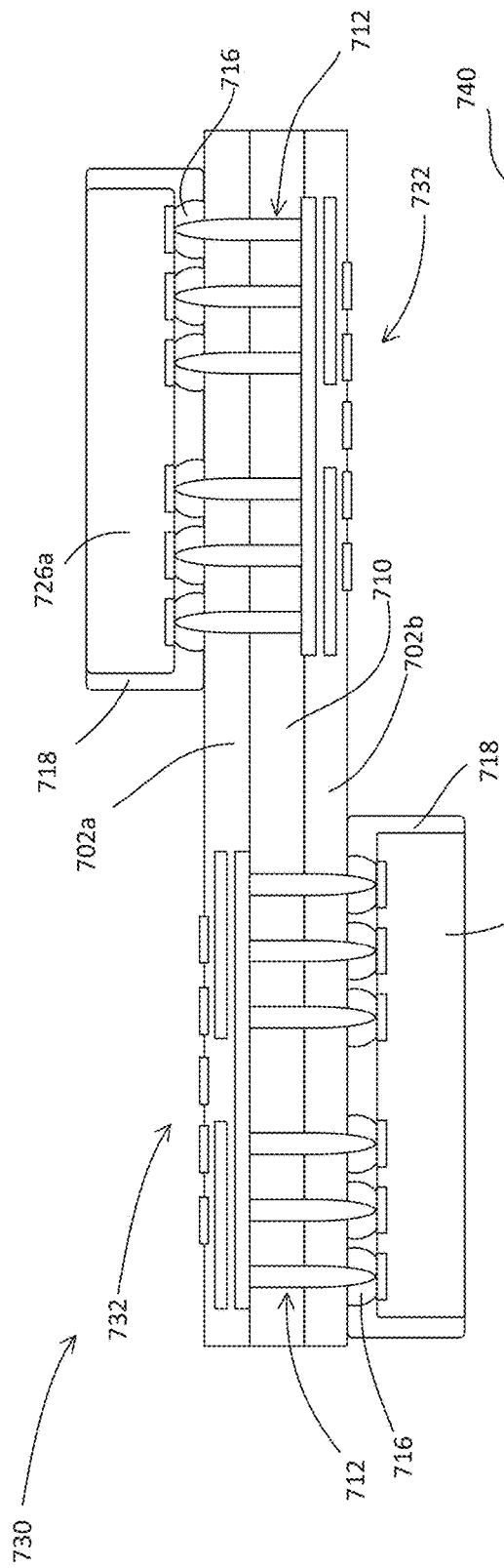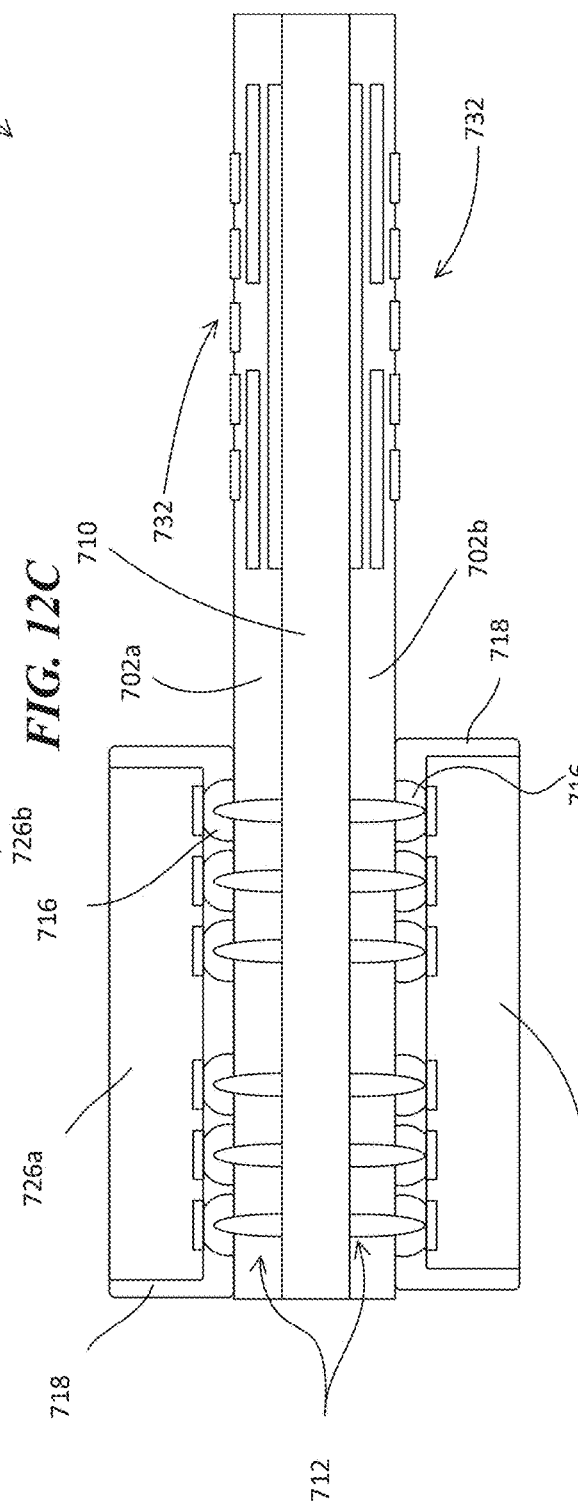
FIG. 12C
FIG. 12D

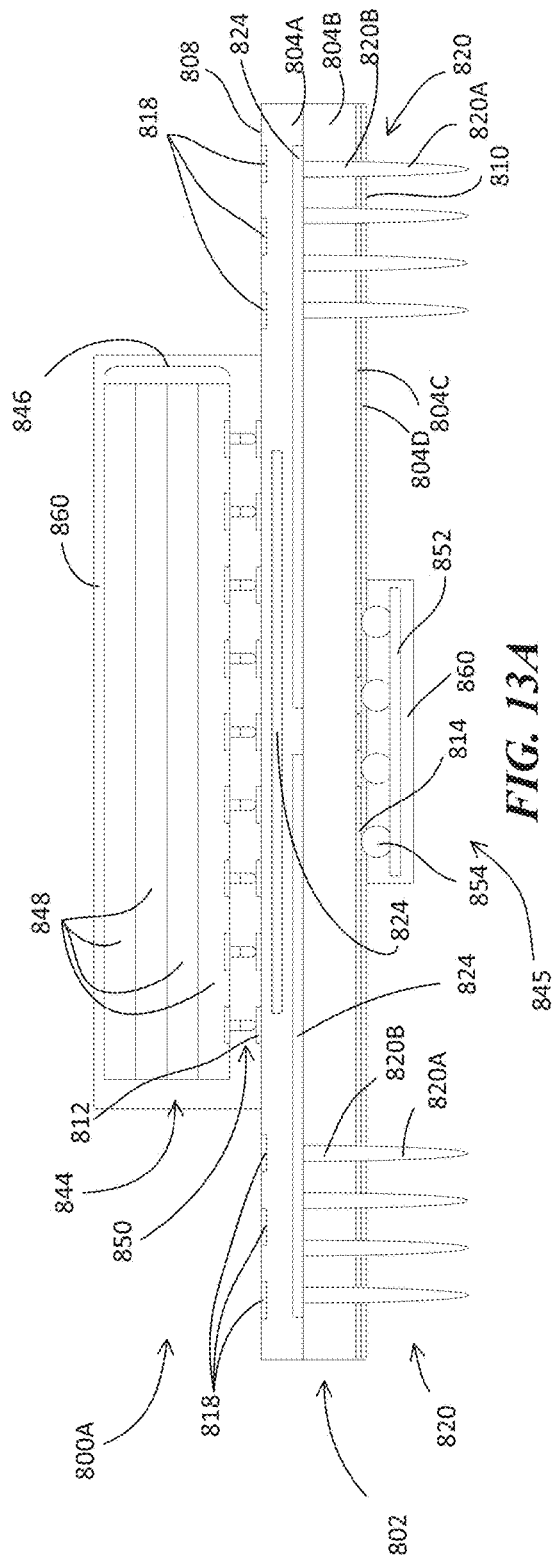
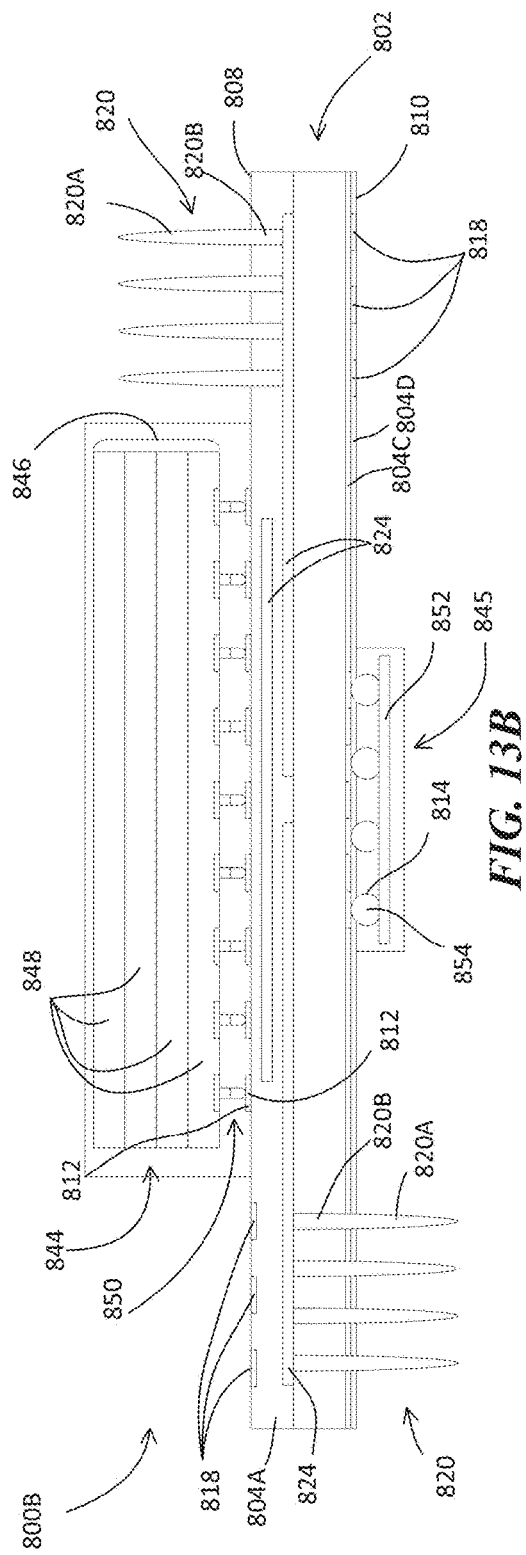

HIGH DENSITY PILLAR INTERCONNECT CONVERSION WITH STACK TO SUBSTRATE CONNECTION

TECHNICAL FIELD

The embodiments described herein relate to semiconductor devices, semiconductor device assemblies, and methods of providing such semiconductor devices and semiconductor device assemblies.

BACKGROUND

Semiconductor device assemblies, including, but not limited to, memory chips, microprocessor chips, imager chips, and the like, typically include a semiconductor device having a die mounted on a substrate. Semiconductor devices may include various functional features, such as memory cells, processor circuits, and imager devices, and bond pads that are electrically connected to the functional features. The semiconductor device assembly may include several semiconductor devices stacked upon and electrically connected to one another by individual interconnects between adjacent devices within a package.

Various methods and/or techniques may be employed to electrically interconnect adjacent semiconductor devices and/or substrates in a semiconductor device assembly. For example, individual interconnects may be formed by reflowing tin-silver (SnAg), also known as solder, to connect a pillar to a pad. Typically, the pillar may extend down from a bottom surface of a semiconductor device towards a pad formed at the top surface of another semiconductor device or substrate. A grid array of solder balls may be used to connect a semiconductor device assembly to a circuit board or other external device.

BRIEF DESCRIPTION OF THE DRAWINGS

FIG. 10A is an illustration of semiconductor devices having connector arrays of different densities.

FIGS. 10B-10C are schematic cross-sectional views of density-conversion connectors connected to die stacks.

FIGS. 11A-11F show various aspects of a method of manufacturing a semiconductor device assembly with exposed TSVs connected to solder balls embedded in an encapsulant.

FIGS. 12A-12F are schematic cross-sectional views of embodiments of semiconductor device assemblies manufactured using one or more aspects of the methods illustrated in FIGS. 11A-11F.

FIGS. 13A-13B are schematic cross-sectional views of embodiments of semiconductor devices having die stack on one side of a substrate, and a controller on the other side of the substrate.

Figure 1:
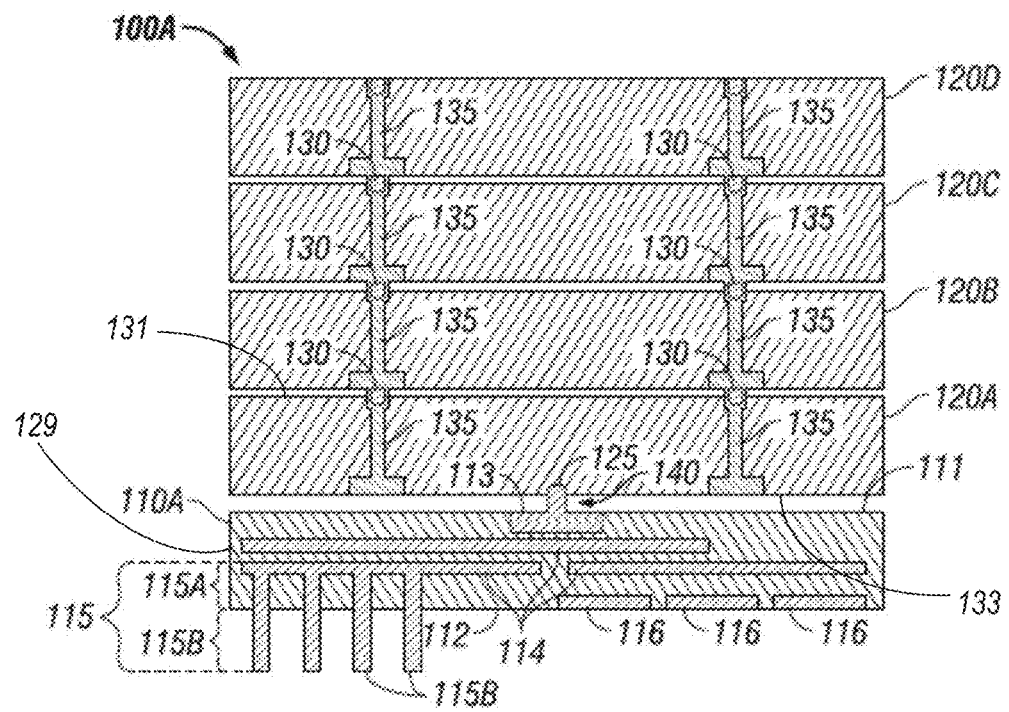
FIG. 1 is a cross-sectional schematic of an embodiment of a semiconductor device assembly.

The present technology is described below with respect to specific embodiments that are shown by way of example in the drawings, but the present technology has various modifications and alternate forms. The following disclosure is accordingly not intended to be limited to the particular examples disclosed. Rather, the intention is to cover all modifications, equivalents and alternatives falling within the scope of the disclosure as defined by the appended claims.

DETAILED DESCRIPTION

Numerous specific details are described herein to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. A semiconductor device assembly may be manufactured as, but is not limited to, a discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor die, but semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor package can also include a substrate that carries one or more semiconductor devices. The substrate may be attached to or otherwise be incorporated within the housing or casing.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature closer to the top of a page than another feature. These terms, however, should be construed to include semiconductor devices and/or semiconductor device assemblies having other orientations, such as inverted or inclined orientations where top/bottom, over/under, above/below, up/down, and left/right can be interchanged depending on the orientation.

Some semiconductor devices may not be connected in a stacked arrangement, or some semiconductor device assemblies may not be connected to a support substrate, using conventional grid arrays of solder balls. For example, it is difficult to connect devices with different densities of connectors using a grid array of solder balls. This difficulty can be amplified in assemblies connecting semiconductor devices with high-density exposed via pillars with standard (e.g., JEDEC standard) contact arrangements. Also, it is desirable to test semiconductor device assemblies while they are connected to an external device.

Various embodiments of this disclosure are directed to semiconductor devices, semiconductor device assemblies, and methods of making and/or operating semiconductor devices and/or semiconductor device assemblies that provide connections for more stacked die arrangements and enable testing while connected to an external device. More specifically, embodiments of the present technology relate to density-conversion connectors configured to electrically couple semiconductor devices having different connector densities. For example, one semiconductor device may utilize exposed TSVs (described below) having a high-density arrangement (e.g., tight spaces between the TSVs) and a second semiconductor device may utilize pads or other connection structures having lower or standard density arrangements (e.g., JEDEC standard layouts). In this regard, several embodiments of the present technology are directed to semiconductor device assemblies that include a first semiconductor device comprising a die stack and electrical connectors projecting from the die stack. The semiconductor device assemblies can include an interposer. The interposer can include a substrate having a first surface facing the first semiconductor device and a second surface opposite the first surface. The interposer can include through vias in which individual vias include an exposed portion and an embedded portion, the exposed portions projecting from one or both of the first surface and the second surface of the substrate, and the embedded portions extending through at least a portion of the substrate between the first surface and the second surface. In some embodiments, the interposer includes one or more test pads at one or both of the first surface and the second surface of the substrate. The interposer can include a first electrical contact at the first surface of the substrate and operably coupled to the first semiconductor device via the electrical connectors, and a second electrical contact at the second surface of the substrate. The semiconductor device assembly can include a controller positioned on an opposite side of the interposer from the first semiconductor device and operably coupled to the interposer via connection to the second electrical contact.

Still other embodiments of the semiconductor assemblies can include a memory stack of dies and a substrate. The substrate can include a first side facing the memory stack of dies and a second side opposite the memory stack of dies. In some embodiments, the substrate includes a first set of contacts at the first side of the substrate and a second set of contacts at the second side of the substrate. The substrate can include a first test pad at the first side and a second test pad at the first side of the substrate and on an opposite side of the memory stack of dies from the first test pad. In some embodiments, the substrate includes a first exposed through via projecting from the second side of the substrate and extending through at least a portion of the substrate between the first side and the second side and a second exposed through via projecting from the second side of the substrate and extending through at least a portion of the substrate between the first side and the second side. The semiconductor device assembly can include a controller operably connected to the second side of the substrate and between the first exposed through via and the second exposed through via.

Methods of assembling a semiconductor device assembly can include providing a substrate. The substrate can have a first surface and a second surface opposite the first surface. The substrate can include through vias extending into the substrate and projecting from the second surface of the substrate and a first contact at the first surface. The substrate can include a second contact at the second surface and at least one test pad at one or both of the first and second surface. The method can include operably coupling a memory stack of dies to the first contact. In some embodiments, the method includes operably coupling a controller to the second contact. In some embodiments, at least one through via projects beyond the controller in a directional normal to the second surface of the substrate and away from the memory stack of dies.

FIG. 1 shows an embodiment of a semiconductor device assembly 100A ("assembly 100A") that includes a first substrate 110A and a second substrate 120A over the first substrate 110A. The first substrate 110A includes a first surface 111 (e.g., a top surface) and a second surface 112 (e.g., a bottom surface) opposite the first surface 111. The first substrate 110A includes at least one pad 113 at the first surface 111 and at least one pad 116 at the second surface 112. The assembly 100A can have pillars 115 that each have an embedded portion 115A within the first substrate 110A and an exposed portion 115B that projects from the second surface 112 of the first substrate 110A. The pillars 115 can be formed by filling through-silicon vias (TSVs) in the first substrate 110A with a conductive material, as discussed herein. As used herein, the term "pillar" can refer to a TSV, a through-wafer via, through via, or other conductive interconnect that is pillar-shaped and extends into and projects out from a wafer, die, substrate, or other semiconductor structure. The pillars 115 can be adjacent a lateral side 129 of the first substrate 110A, as shown in FIG. 1. The assembly 100A can also have interconnections 114 within the first substrate 110A and pads 116 at the second surface 112. The interconnections 114 can electrically couple the pillars 115 with one or more of the pads 113 and/or electrically couple the pads 116 with corresponding pads 113.

The second substrate 120A can include a first surface 131 (e.g., a top surface), a second surface 133 (e.g., a bottom surface) opposite of the first surface 131, and one or more pillars 125 that project from the second surface 133 of the second substrate 120A (e.g., toward the first substrate 110A). The assembly 100A also has an interconnect 140 comprising the pillar 125 of the second substrate 120A and the pad 113 located at the first surface 111 of the first substrate 110A. The interconnect 140 electrically connects the first substrate 110A with the second substrate 120A. The second substrate 120A can include several pillars 125 and the first substrate 110A can include several pads 133, and thus the assembly 100A can include several interconnects 140.

The assembly 100A can further include additional substrates, such as a third substrate 120B over the second substrate 120A, a fourth substrate 120C over the third substrate 120B, a fifth substrate 120D over the fourth substrate 120C, etc. The second-fifth substrates 120A-120D can be electrically coupled by vias 135 and interconnects 130. The vias 135 can be through silicon vias that extend through the substrates 120A-120D, and the interconnects 130 can be conductive features between adjacent substrates 120A-120D. The electrical interconnects between the substrates 110A, 120A, 120B, 120C, 120D are shown schematically for clarity and may be varied as would be appreciated by one of ordinary skill in the art having the benefit of this disclosure. In some embodiments, the assembly 100A can include more or fewer than five substrates (e.g., at least three, at least seven, and/or at least ten substrates). The semiconductor device assembly 100A may include the first substrate 110A and the second substrate 120A alone.

The interconnections 130, 140 electrically connect each of the substrates 110A, 120A, 120B, 120C, 120D together. The pads 116 at the second surface 112 of the first substrate 110A may be test pads configured to permit testing of the semiconductor device assembly 100A. For example, a probe may contact one of the pads 116 to test the operational functionality of any one of the substrates 110A, 120A, 120B, 120C, 120D of the semiconductor device assembly 100A. In some embodiments, one or more pads 116 (e.g., test pads) are located on both the first surface 111 and the second surface 112 of the first substrate 110A. The first substrate 110A may be a silicon substrate or other semiconductor device, such as a logic device, or it can be a printed circuit board or the like. The second substrate 120A, third substrate 120B, fourth substrate 120C, and fifth substrate 120D may be various semiconductor devices. For example, one or more of the second substrate 120A, third substrate 120B, fourth substrate 120C, and fifth substrate 120D may be memory devices. The number, configuration, type, size, and/or location of the substrates may be varied depending on the application as would be appreciated by one of ordinary skill in the art having the benefit of this disclosure. For example, the semiconductor device assembly 100A may comprise more or fewer substrates than shown. Likewise, the number, size, type, location, and/or configuration of the pillars, pads, and/or interconnections are shown for illustrative purposes and may be varied depending on application as would be appreciated by one of ordinary skill in the art having the benefit of this disclosure.

Figure 2:
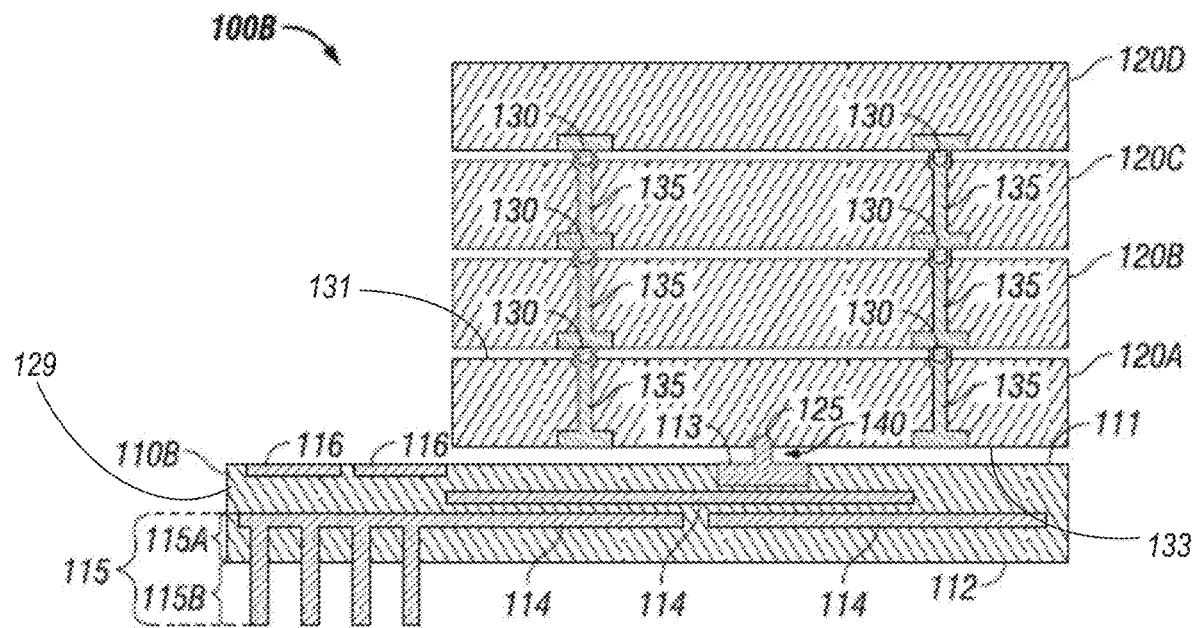
FIG. 2 is a cross-sectional schematic of an embodiment of a semiconductor device assembly.

FIG. 2 shows an embodiment of a semiconductor device assembly 100B ("assembly 100B") that includes a first substrate 110B and second-fifth substrates 120A-120D. The assembly 100B has pads 116 at the first surface 111 of the first substrate 110B instead of the second surface 112 of the first substrate 110A shown in FIG. 1. Also, the fifth substrate 120 may not include vias 135. Otherwise the assembly 100B is the same as the assembly 100A and like reference numbers refer to like components such that the description of the assembly 100A with respect to FIG. 1 applies to the assembly 100B shown in FIG. 2.

Figure 3:
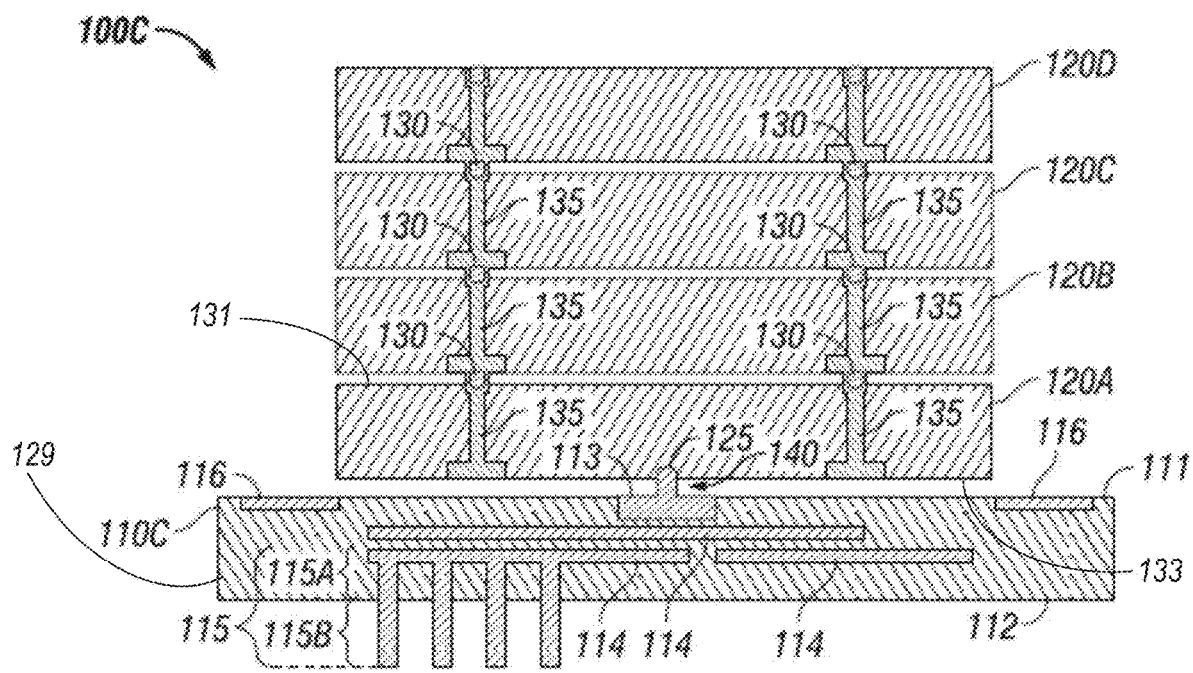
FIG. 3 is a cross-sectional schematic of an embodiment of a semiconductor device assembly.

FIG. 3 shows an embodiment of a semiconductor device assembly 100C ("assembly 100C") that includes a first substrate 110C and second-fifth substrates 120A-120D. The assembly 100C has pads 116 at the first surface 111 of the first substrate 110C instead of the second surface 112 of the first substrate 110A shown in FIG. 1. Also, the pads 116 are on either side of the stack of substrates 120A-120D, rather than on only one side of the stack of substrates 120A-120D. Also, the fifth substrate 120 may or may not include vias 135. Otherwise the assembly 100C is the same as the assembly 100A and like reference numbers refer to like components such that the description of the assembly 100A with respect to FIG. 1 applies to the assembly 100C shown in FIG. 3.

Figure 4:
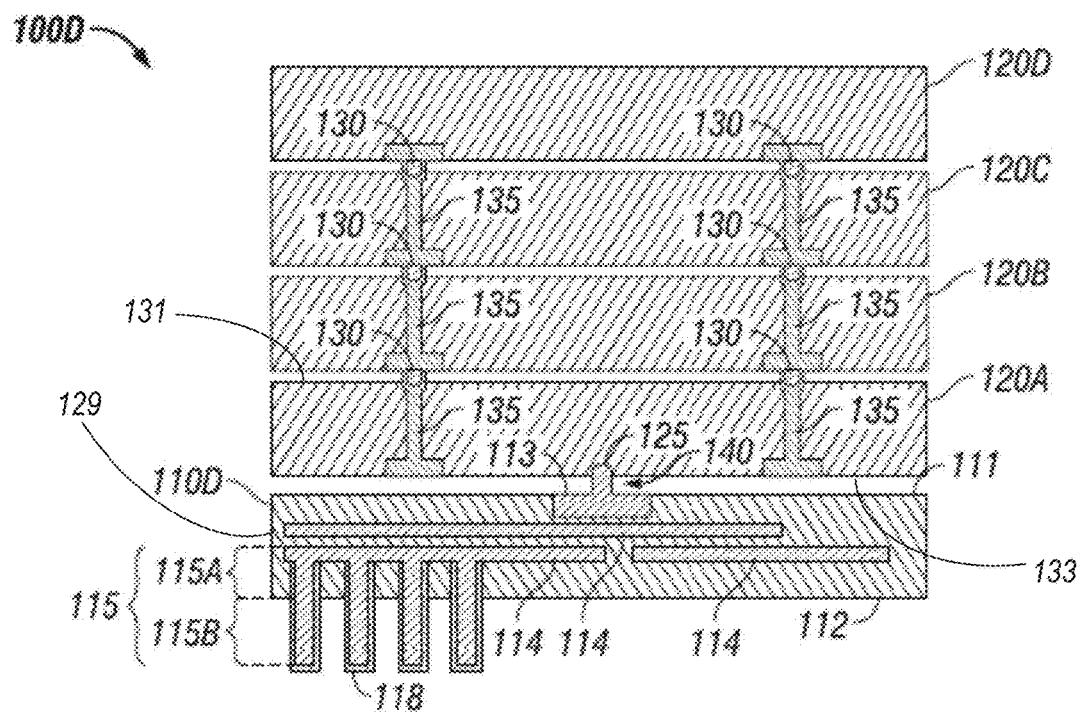
FIG. 4 is a cross-sectional schematic of an embodiment of a semiconductor device assembly.

FIG. 4 shows an embodiment of a semiconductor device assembly 100D ("assembly 100D") that includes a first substrate 110D and second-fifth substrates 120A-120D. The pillars 115 of the assembly 100D can include an exterior layer or coating 118 (described in more detail below). The external layer 118 can be a protective layer that reduces the risk of damage to the pillars 115 (e.g., to the exposed portions 115B of the pillars, which may comprise copper and/or other soft materials) by probes or other mechanisms used to test the semiconductor device assembly 100D (e.g., testing via contact between the probe and the pillars 115). The exterior layer or coating 118 may include various materials that permit the probing of a pillar 115 that may be removed by subsequent processing. For example, the exterior layer 118 may include, but is not limited to, tantalum. Also, the fifth substrate 120 may not include vias 135. Otherwise the assembly 100D is the same as the assembly 100A and like reference numbers refer to like components such that the description of the assembly 100A with respect to FIG. 1 applies to the assembly 100D shown in FIG. 4.

Figure 5:
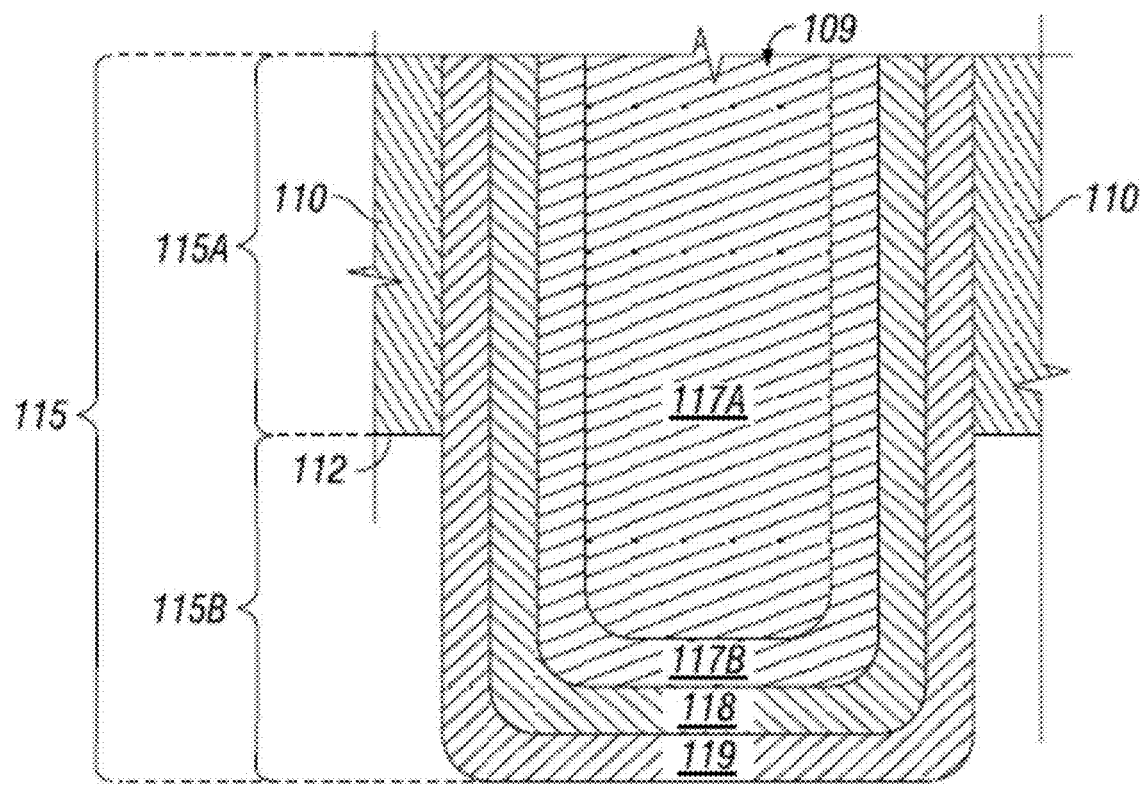
FIG. 5 is a partial cross-section schematic of an embodiment of a semiconductor device.

FIG. 5 is a partial cross-section schematic of an embodiment of a substrate 110. The substrate 110 includes a plurality of vias, or TSVs, 109 (only one shown in FIG. 5) in the substrate 110. Various methods may be used to form a TSV 109. For example, the TSV 109 includes an oxide layer 119, a tantalum layer 118 on the oxide layer 119, and an inner conductive material 117 within the tantalum layer 118. The inner conductive material 117 can include a first conductive portion 117B on the tantalum layer 118 and a second conductive portion 117A within the first conductive portion 117B. For example, the first conductive portion 117B may be deposited via physical vapor deposition while the second conductive portion 117A may be deposited via electrochemical deposition. The first and second conductive portions 117A, 117B may comprise copper, tungsten, poly silicon, or the like. The TSVs can also be formed using other methods as known in the art.

A portion of the substrate 110 may be removed (e.g., ground, etched, removed using chemical-mechanical planarization, and/or ablated) to expose a portion of the TSV 109, which results in an exposed portion 115B of pillar 115. A portion of the TSV 109, also referred to as an embedded portion 115A, remains within the substrate 110. If the substrate 110 includes test pads 116 (shown in FIGS. 1-3), then the oxide layer 119 and tantalum layer 118 may be removed to provide an exposed conductive pillar 115B. In some embodiments, if the substrate 110 does not include any test pads 116, then only the oxide layer 119 may need to be removed leaving the exposed portion 115B of the pillar 115, or TSV 109, to be coated with a tantalum layer 118. The tantalum layer 118 can enable the probing of the exposed portion 115b of the pillar 115 to test the substrate 110 while reducing or eliminating the likelihood of damaging the conductive layers 117A, 117B of the pillar 115. After the substrate 110 has been tested, the tantalum layer 118 may be removed to potentially leave an unmarked exposed pillar 115B, which may be comprised of copper.

Figure 6:
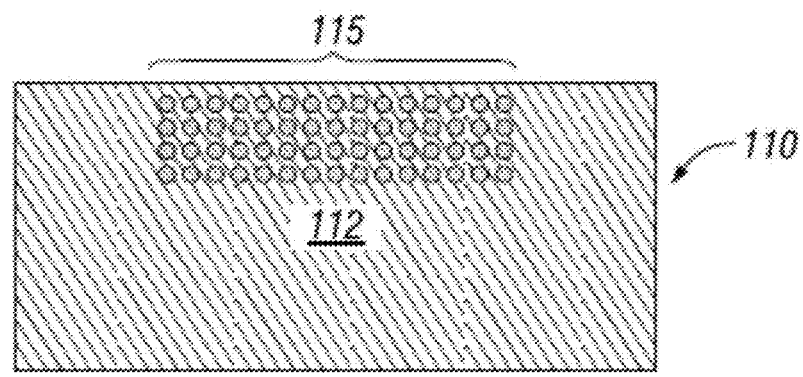
FIG. 6 is a bottom view schematic of an embodiment of a semiconductor device.

FIG. 6 is a bottom view schematic of an embodiment of a semiconductor device 110. The bottom surface 112 of the semiconductor device 110 includes a plurality of pillars 115 arranged in a high-density rectangular array. As shown in FIG. 6, the rectangular array of pillars 115 is adjacent to a side 141 of the bottom surface 112 of the semiconductor device 110. The array is shown as a four (4) by fifteen (15) array of pillars 115 for clarity. The size of the array, shape of the array, and/or number of pillars 115 may be varied depending on the application. For example, one embodiment may include an array of eight (8) by one hundred twenty-three (123) pillars adjacent to a side of the semiconductor device 110. The array area may be thirteen (13) mm by six (6) mm, the pad size for each pillar may be fifty-four (54) microns, and the pad pitch may be sixty (60) microns.

FIGS. 7A-7E show aspects of forming an embodiment of a semiconductor device 210. A first layer 212A may be deposited onto a surface of a substrate 211, which may be a silicon substrate (see FIG. 7A), and a plurality of pads 216 (e.g., test pads) may be formed in the first layer 212A. The number, size, location, and/or configuration of the pads 216 may be varied. The first layer 212A is shown as a single layer for clarity in FIG. 7A. However, the first layer 212A may be comprised of multiple layers deposited onto the surface of the silicon substrate 211.

Figure 7A:
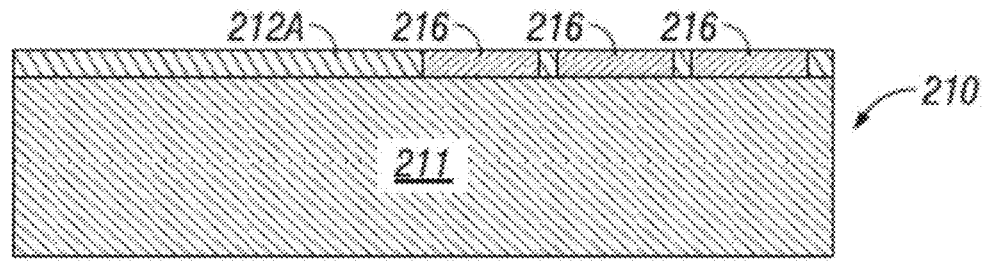
FIG. 7A is a cross-sectional schematic of an embodiment of a semiconductor device.
Figure 7B:
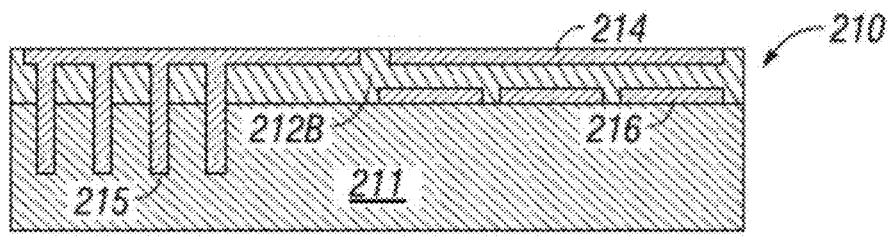
FIG. 7B is a cross-sectional schematic of an embodiment of a semiconductor device.

FIG. 7B shows at least one second layer 212B has been added to the semiconductor device 210. The second layer 212B can be added to the first layer 212A. The second layer 212B can include interconnects 214, or the like, that will provide electrical connections between various elements, such as the pillars 215 and pads 216, of the semiconductor device 210. The second layer 212B is shown as a single layer for clarity in FIG. 7B, but can also comprise multiple layers. For example, the at least second layer 212B may comprise multiple layers deposited onto the surface of the silicon substrate 211 and/or onto the first layer 212A. A plurality of TSVs, or vias, can be formed in the layers 212A, 212B and can extend into a portion of the silicon substrate 211. The TSVs are filled with a conductive material, such as copper, or the like, to form pillars 215. Various coatings may be applied to the TSVs prior to the depositing of the conductive material, as discussed herein.

Figure 7C:
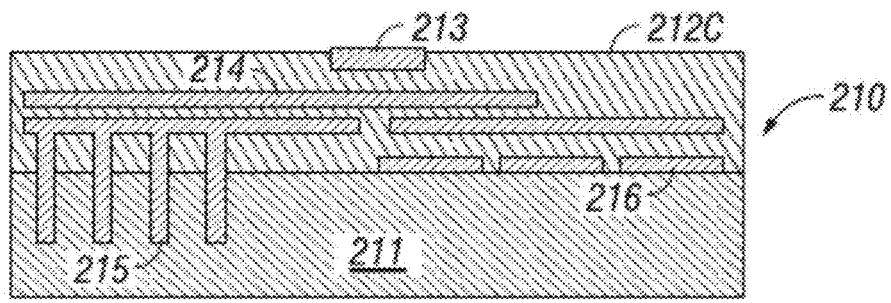
FIG. 7C is a cross-sectional schematic of an embodiment of a semiconductor device.

FIG. 7C shows at least one third layer 212C added to the semiconductor device 210. The third layer 212C can include at least one pad 213, for electrically connecting the semiconductor device 210 to an adjacent semiconductor device. The third layer 212C is shown as a single layer for clarity in FIG. 7C. However, the third layer 212C may comprise multiple layers deposited onto one or more of the first layer(s) 212A, the second layer(s) 212B, and the surface of the silicon substrate 211. As discussed above, at least one pad 213 can be formed in the layers 212C. The interconnects 214 can electrically connect the pad 213 with one or both pillars 215 and the test pads 216.

Figure 7D:
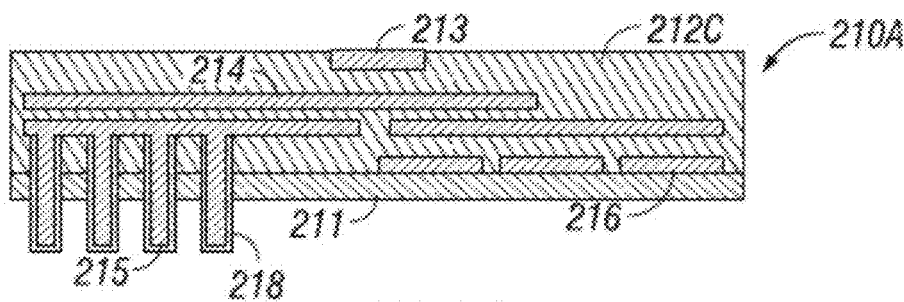
FIG. 7D is a cross-sectional schematic of an embodiment of a semiconductor device.

FIG. 7D shows an embodiment of a semiconductor device or substrate 210A after a portion of the silicon substrate 211 has been removed to expose a portion of the plurality of pillars 215 while leaving a portion of the silicon substrate 211 on the bottom of the semiconductor device 210A. Various processes may be used to remove the portion of the silicon substrate 211. The silicon substrate 211 prevents probing of the pads 216. Instead, the semiconductor device 210A may be tested by probing one or more of the pillars 215. The pillars 215 can include an exterior coating 218, which can enable the pillars 215 to be probed while reducing the risk of marking and/or damage to the inner conductive portion of the pillar 215, as discussed herein. The coating 218 may be various, such as tantalum. The coating 218 may be removed from the exterior of the pillars 215 after desired testing of the semiconductor device 210A, as discussed herein.

Figure 7E:
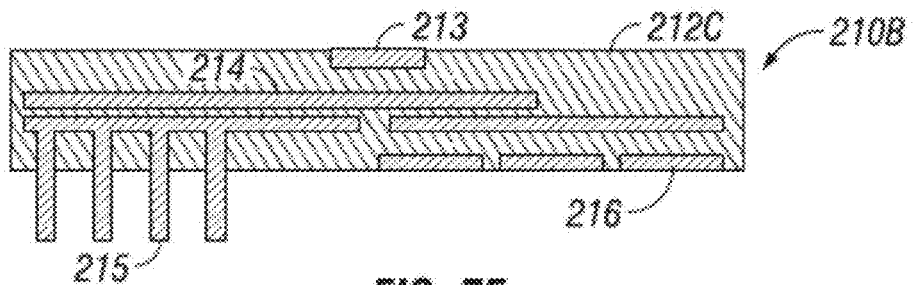
FIG. 7E is a cross-sectional schematic of an embodiment of a semiconductor device.

FIG. 7E shows an embodiment of a semiconductor device or substrate 210B after the remaining portion of the silicon substrate 211 has been removed from the bottom of the semiconductor device 210B to expose the test pads 216. Various processes may be used to remove the portion of the silicon substrate 211. The semiconductor device 210B may be tested by the probing of one or more of the pads 216. Likewise, the pads 216 may be probed to test other semiconductor devices that may be electrically connected to the semiconductor device 210B via pad 213 at the top surface of the semiconductor device 210B.

Figure 8:
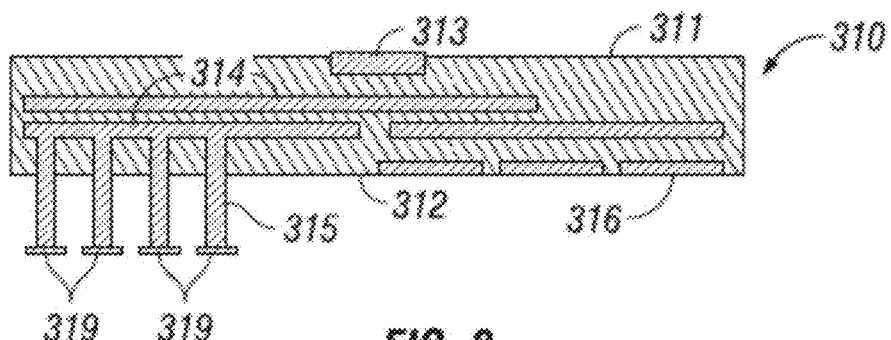
FIG. 8 is a cross-sectional schematic of an embodiment of a semiconductor device.

FIG. 8 shows an embodiment of a semiconductor device or substrate 310. The semiconductor device 310 includes a pad 313 at the top surface and pads 316 at the bottom surface. A plurality of pillars 315 extend from the bottom surface of the semiconductor device 310 with a portion of the pillars 315 remaining embedded within the semiconductor device 310. As discussed herein, the pillars 315 are formed by filling TSVs in the semiconductor device 310 with copper, or the like. The pillars 315 can be adjacent to a side of the semiconductor device 310. Interconnections 314 within the semiconductor device 310 can electrically connect the pillars 315 with the pad 313 at the top surface. Likewise, the interconnections 314 within the semiconductor device 310 can electrically connect the pads 116 at the bottom surface of the semiconductor device 310 with the pad 113 at the top surface as well as the pillars 315. The pillars 315 can include feet 319 located at the end of each pillar 315. The feet 319 may aid in connecting of the pillars 315 to an external device.

Figure 9:
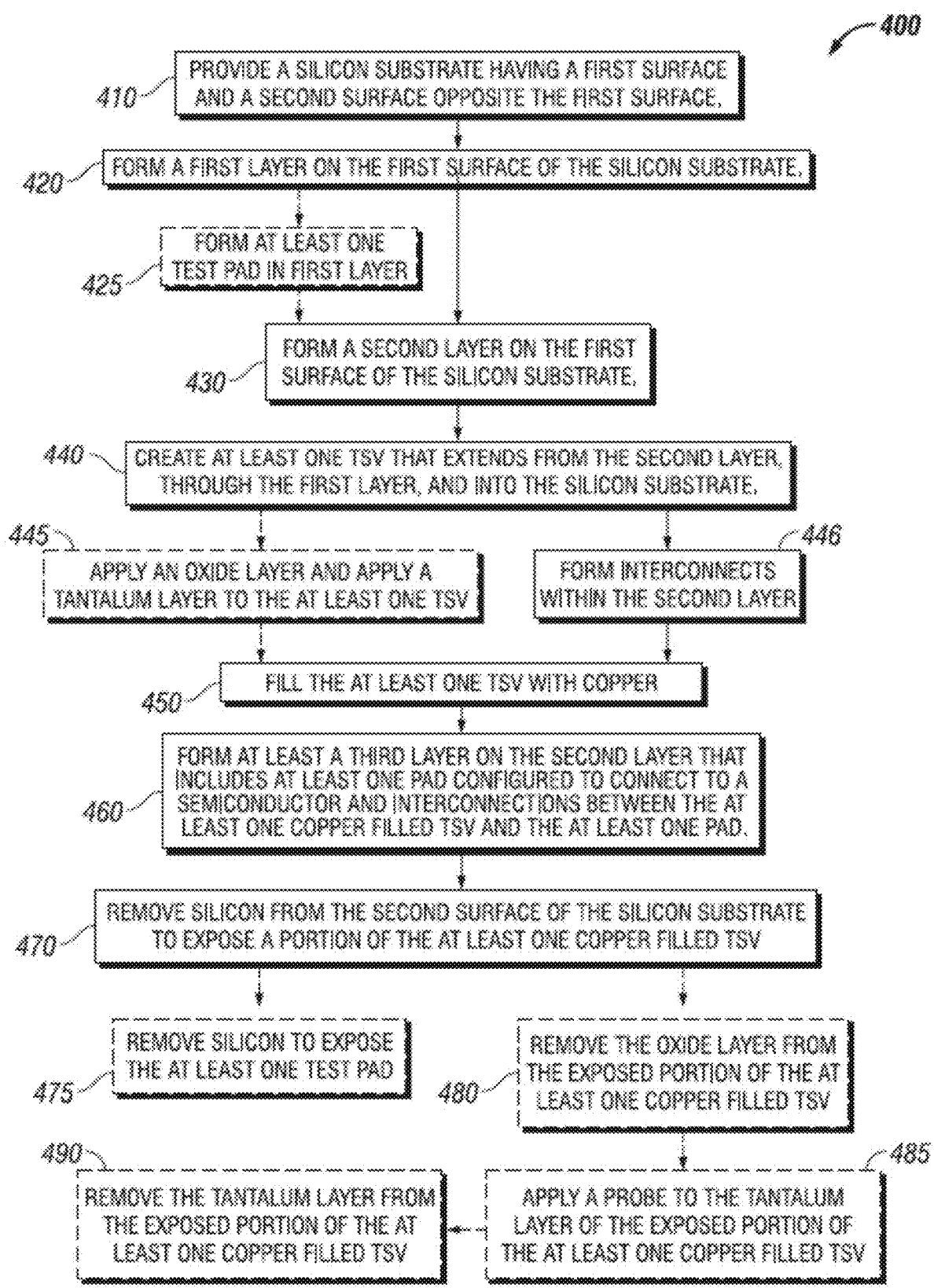
FIG. 9 is a flow chart of one embodiment of a method of making a semiconductor device assembly.

FIG. 9 is a flow chart of one embodiment of a method 400 of making a semiconductor device assembly. The method 400 can include providing a silicon substrate having a first surface and a second surface opposite the first surface, at step 410. The method 400 can include forming a first layer on the first surface of the silicon substrate, at step 420. The first layer may be comprised of multiple layers deposited on the surface of the silicon substrate as would be appreciated by one of ordinary skill in the art having the benefit of this disclosure. At optional step 425, the method 400 may include forming at least one test pad in the first layer, which may be multiple layers, deposited on the surface of the substrate. The method 400 can include forming a second layer on the semiconductor device, at step 430. As discussed herein, the second layer may be comprised of multiple layers deposited on the first layer, or first layers, on the silicon substrate.

At step 440, the method 400 can include creating at least one TSV that extends from the second layer, or second layers, through the first layer, or first layers, and into at least a portion of the silicon substrate. The method 400 may include forming a plurality of TSVs, which may be formed in an array (e.g., a rectangular array, circular array, linear array, or other shaped array). The array can be adjacent to a side of the silicon substrate. The method 400 may include forming interconnects within the second layer, or second layers, as discussed herein, at step 446. The method 400 may include applying an oxide layer and applying a tantalum layer to the at least one TSV, at optional step 445. At step 450, the method 400 can include filling the at least one TSV, or the plurality of TSVs, with copper, or the like.

The method 400 can include forming at least a third layer on the second layer. The third layer can include at least one pad that is configured to connect to a semiconductor device and forming interconnections between the at least one copper filled TSV and the at least one pad, at step 460. The third layer may be comprised of multiple layers deposited on second layer, or second layers, as would be appreciated by one of ordinary skill in the art having the benefit of this disclosure. The method 400 can include removing silicon from the second or bottom surface of the silicon substrate to expose a portion of the at least one copper, or the like, filled TSV, or a portion of the plurality of copper, or the like, filled TSVs, at step 470. The method 400 may include removing silicon to expose the at least one test pad, at optional step 475. The method 400 may include removing the oxide layer from the exposed portion of the at least one copper, or the like, filled TSV, at optional step 480. The method 400 may include applying a probe to the tantalum layer of the exposed portion of the at least one copper, or the like, filled TSV, at optional step 485. The method 400 may include removing the tantalum layer of the exposed portion of the at least one copper, or the like, filled TSV, at optional step 490.

Semiconductor device assemblies with high-density exposed via arrays (e.g., pillar arrays), such as those described above with reference to FIGS. 1-9, often need to be connected to semiconductor device assemblies having lower-density connection arrays. This is particularly the case when the external connections are exposed portions of TSVs because TSV arrays can have higher densities than many other types of arrays. For example, as illustrated in FIG. 10A, it may be desirable to connect a first semiconductor device or device assembly 500A that has a high-density array of pillars or exposed vias (e.g., exposed portions of TSVs or other through-vias) 515 with a second semiconductor device 500B having a lower-density array of connections 516 (e.g., a lower-density array of pads, solder connections, pillars, or other connection structure). The high-density array of pillars 515 has a smaller average lateral distance (e.g., high-density pitch) between the pillars 515 than the average lateral distance (e.g., low-density pitch) between the connections 516. The average lateral distance can be measured between the center points of adjacent pillars 515 or connections 516. In some embodiments, the average lateral distance of the high-density pillars 515 (e.g., the exposed TSV portions) is less than 100 microns, less than 90 microns, less than 80 microns, less than 70 microns, and/or less than 60 microns. In some embodiments, the footprint of the array of connections 516 is larger than the footprint of the array of pillars 515, as measured parallel to the respective substrates through/on which the pillars and connections are formed. This relative difference in size of footprint can be present when the respective arrays of pillars and connections 515, 516 have the same number of pillars/connections.

FIGS. 10B and 10C show a density-conversion connector 520 for connecting a first semiconductor device assembly 500A having a high-density array of pillars 515 to devices having lower-density arrays. The density-conversion connector 520 can include a substrate 522 having a first side 524, a second side 526 opposite the first side 524, a first array of pads 528 or other contacts at the first side 524, and a second array of pads 530 at the second side 526. In the embodiment shown in FIGS. 10B and 10C, the second array of pads 530 has a lower density than the first array of pads 528. For example, the density of the first array of pads 528 is the same as or similar to the density of the array of pillars 515 on the semiconductor device assembly 500A, and the density of the second array of pads 530 can be the same as or similar to the density of the array of connectors 516 of the second semiconductor device 500B (FIG. 10A). Various electrical connection structures (e.g., TSVs, interconnects, etc.) may be embedded in the substrate 522 to connect the first array of pads 528 to the second array of pads 530.

The first semiconductor device assembly 500A can include a die stack 540 (e.g., a memory stack) with dies 541 and a substrate 542 (e.g., an interposer, wafer, or other substrate) to which the die stack 540 is mounted. The pillars 515 have an exposed portion 515B that projects away from the lower surface of the substrate 542 toward the density-conversion connector 520. The first semiconductor device assembly 500A can also include one or more test pads 544 at one or more surfaces of the substrate 542. The exposed portions 515B of the pillars 515 are operatively and/or electrically connected to corresponding pads 528 of the density-conversion connector 520 via one or more solder balls 550 or other connection structures. For example, exposed portions 515B pillars 515 can be at least partially embedded in the solder balls 550 to establish connection between the pillars 515 and the pads 528. The pillars 515 also have embedded portions 515A that extend at least partially through one or more of the substrate 542 and the die stack 540. The pillars 515 are through vias, such as TSVs, that extend through the substrate 542 and connect to TSVs 517 that extend at least partially through the die stack 540. In some embodiments, the TSVs 517 are narrower than the through vias 515. In some embodiments, as illustrated in FIG. 10C, the pillars 515 can be in physical contact with the pads 528 to reduce the distance D1 between the first semiconductor device assembly 500A and the substrate 522 of the density-conversion connector 520. The space between the first semiconductor device assembly 500A and the substrate 522 can be filled using known underfill techniques. The second side 526 of the density-conversion connector 520 can include a standard ball-out configuration of pads 530 and/or solder balls 554 (e.g., JEDEC standard and/or other standard) to electrically connect the density-conversion connector 520 to other semiconductor devices. In some embodiments, the solder balls 554 on the second side 526 of the density-conversion connector 520 can be larger than the solder balls 550 on the first side 524 of the density-conversion connector 520.

Although the density-conversion connector 520 is illustrated and described for use in connection with semiconductor devices having high-density pillar connection, other types of semiconductor devices can also benefit from a high-to-low or low-to-high density-conversion connector 520. Utilization of a density-conversion connector 520 as described herein can electrically couple custom-density devices (e.g., devices designed for customer or device-specific applications) to other-density devices (e.g., devices with different custom designs or industry-standard connection arrangements).

In some applications, it may be desirable to encapsulate or at least partially-encapsulate the TSV-solder connection points between semiconductor devices during manufacture. These methods can be useful for package-on-package (PoP), package-on-interposer, multi-interposer, PoP-on-interposer, interposer to multi-substrate, and/or other applications. For example, as illustrated in FIGS. 11A-11F and described below, it may be advantageous to encapsulate solder ball connections before inserting the TSVs into the solder balls. Referring to FIG. 11A, the method can include forming solder balls 602 on pads 604 or other types of contacts on a substrate 606. The solder balls 602 and pads 604 can be on one or more surfaces of the substrate 606 (e.g., on one, two, three, four, five, six, or more surfaces of the substrate 606). In some embodiments, the solder balls 602 may be partially or fully hardened on the pads 604. Referring to FIG. 11B, the method can include encapsulating the solder balls 602 and pads 604 with an encapsulant 610, such as a compression mold material or a reflow resistant.

FIG. 11C shows the method after the encapsulant 610 and solder balls 602 have been ground or otherwise removed to form a top surface 612 (e.g., a mating surface). In some embodiments, chemical-mechanical planarization (CMP) can be used to removes an upper portion of the encapsulant 610 and solder balls 602 to form the top surface 612. In some embodiments, the top surface 612 is planar. In some embodiments, nonplanar surface features can be formed on the top surface 612. For example, the solder balls 602 may be ground or otherwise removed further than the surrounding encapsulant 610, which may result in one or more indentations in the top surface 612 in the vicinity of the solder balls 602.

FIG. 11D shows aspects of the method after an interposer or die 616 having exposed or partially exposed TSVs 618 extending from a surface thereof is aligned with the substrate 606. More specifically, the TS Vs 618 are at least substantially aligned with corresponding solder balls 602. The method can include reflowing the solder balls 602 by, for example, increasing the temperature of the solder balls 602 to a reflow temperature. Referring to FIG. 6E, the exposed portions of the TSVs 618 can be inserted at least partially into corresponding reflowed solder balls 602. In some embodiments, the exposed portions of the TSVs 618 are inserted into the reflowed solder balls 602 such that the TSVs 618 contact the pads 604. In some applications, a space between the interposer or die 616 in the top surface 612 of the planarized encapsulant 610 and solder balls 602 can exist after inserting the TSVs 618 into the solder balls 602.

FIG. 11F illustrates the method after the space between the top surface 612 of the planarized encapsulant 610 and the interposer or die 616 has been underfilled. A nonconductive film (NCF) 620 or other material can be on the top surface 612 before inserting the TSVs 618 into the reflowed solder balls 602, or the NCF 620 can be on a surface of the interposer or die 616 surrounding the TSVs 618 before inserting the TSVs 618 into the reflowed solder balls 602. The NCF 620 can seal, insulate and protect the connections between the interposer die 616 and the substrate 606 in much the same manner as underfilling the space between the top surface 612 and the interposer or die 616.

Figure 12A:
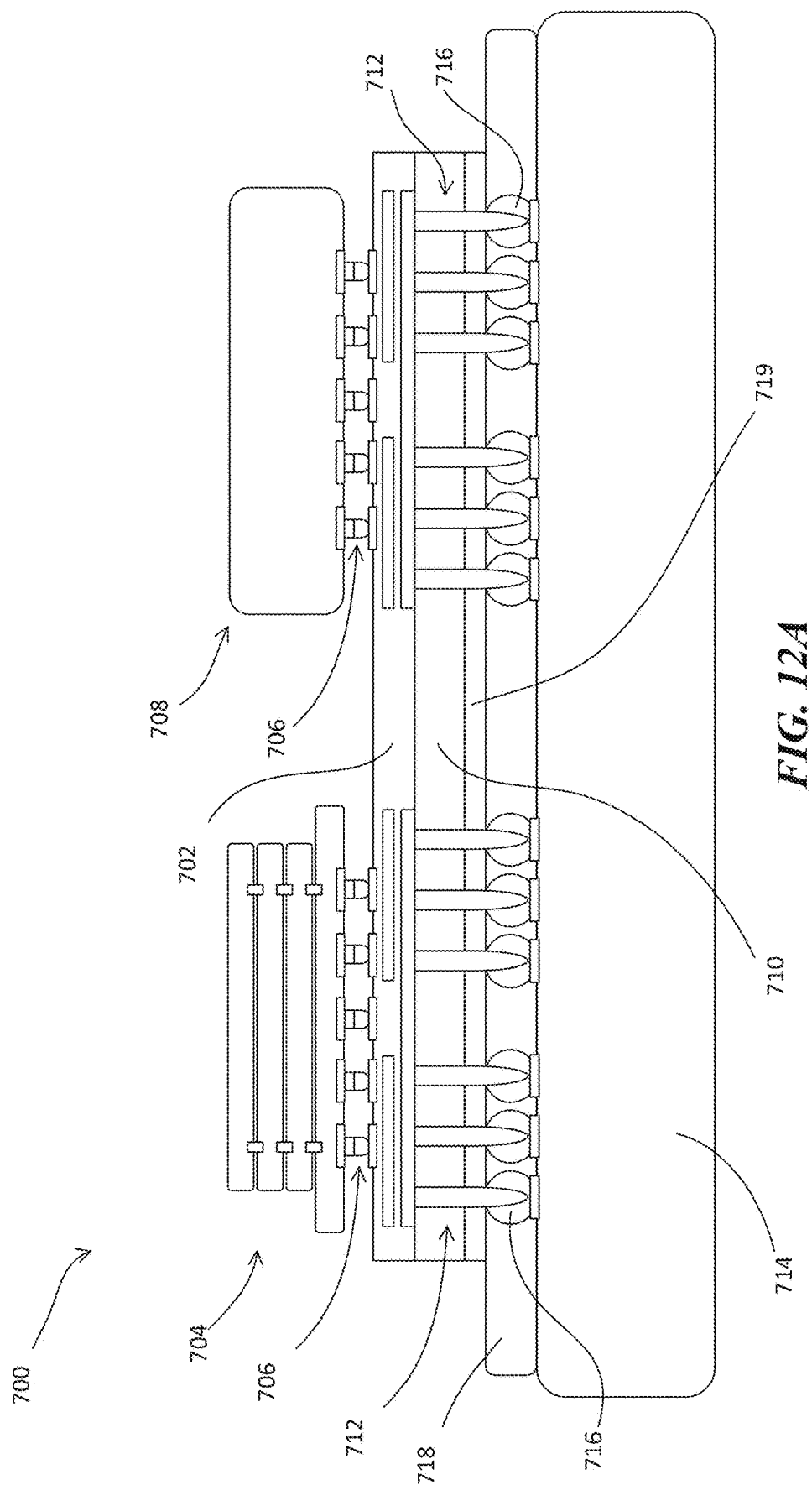

The methods and structures described above with respect to FIGS. 11A-11F can be used to manufacture many different types of semiconductor device assemblies. FIGS. 12A-12F illustrate some such semiconductor device assemblies. For example, FIG. 12A illustrates a semiconductor device assembly 700 having one or more semiconductor devices connected to a substrate 702. In some embodiments, the semiconductor device assembly 700 includes a first semiconductor device 704, such as a high-bandwidth memory device (HBM) comprising one or more memory dies or other semiconductor device. The first semiconductor device 704 can be connected to the substrate 702 by the pillars 706 (e.g., copper pillars), solder balls, and/or other electrical connections. The semiconductor device assembly 700 can include a second semiconductor device 708, such as a system on a chip (SOC) or other semiconductor device. The second semiconductor device 708 can be connected to the substrate 702 via pillars, solder balls, and/or other electrical connections.

The substrate 702 may be connected to an interposer 710 having TSVs 712 that extend from the interposer 710 and/or the substrate 702. The TSVs 712 can be connected to a substrate 714 using the methods described above with respect to FIGS. 11A-11F. For example, the TSVs 712 can be inserted into reflowed solder balls 716 which were previously encapsulated with an encapsulant 718 and planarized to form a top surface. The space between the encapsulant 718 and the interposer 710 or substrate 702 can be underfilled or filled with an NCF 719.

Figure 12B:
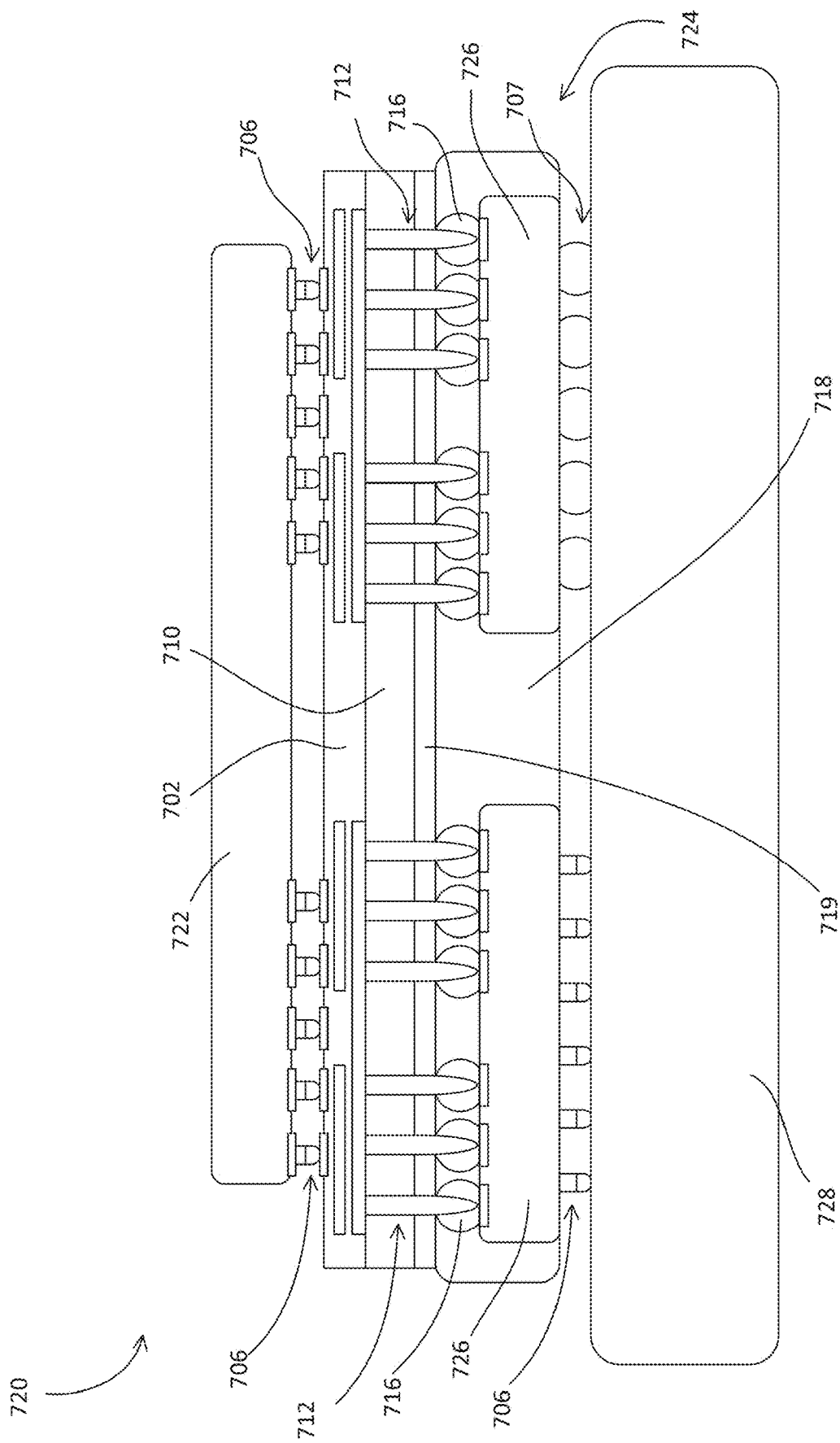

FIG. 12B illustrates an embodiment of a semiconductor device assembly 720 including a single or multi-ship device 722. The device 722 can be connected to the substrate 702 via pillars 706, solder balls, and/or other electrical connections. In some embodiments, the substrate 702 is coupled to an interposer 710 that has TSVs 712 which extend from the substrate 702 and/or the interposer 710. The semiconductor device assembly 720 can include an intermediate semiconductor device 724. The intermediate semiconductor device 724 can include one or more single or multichip devices 726. While electrically connecting the substrate 702/interposer 710 to the intermediate semiconductor device 724 (e.g., using the methods described above with respect to FIGS. 11A-11F), one or both of the single or multichip devices 726 may be at least partially encapsulated by an encapsulant 718. In some embodiments, each of the single or multichip devices 726 are separately encapsulated. In some embodiments, one or more of the single or multichip devices 726 are not encapsulated. The space between the encapsulant 718 and the substrate 702/interposer 710 can be filled with NCF or underfilled material 719. In some embodiments, the intermediate semiconductor device 724 is connected to a substrate 728 via pillars 706 or solder ball connections 707. Connection between the substrate 728 and the intermediate semiconductor device 724 can be made using ball flip chip.

FIG. 12C illustrates an embodiment of a semiconductor device assembly 730 having a first substrate 702a, a second substrate 702b, and TSVs 712 that can extend from each of the first substrate 702a and the second substrate 702b. The TSVs 712 can extend in opposite directions and/or at separate lateral positions (e.g., positions spaced apart in a direction parallel to the plane of the substrates 702a, 702b). The semiconductor device assembly 730 can further include single or multichip devices 726a, 726b connected to the TSVs 712 on opposite sides of the semiconductor device assembly 730 using the methods described above with respect to FIGS. 11A-11F and FIG. 12B. One or both of the first and second substrates 702a, 702b can include pads 732, testbeds, or other electrical connections formed at the substrates spaced apart from the TSVs 712. As illustrated in FIG. 12D, a semiconductor device assembly 740 can include the same components as the semiconductor device assembly 730, wherein the first and second single or multichip devices 726a, 726b are vertically aligned with each other on opposite sides of the substrates 702a, 702b, and pads 732 are vertically aligned with each other on opposite sides of the substrates 702a, 702b. In some embodiments, the semiconductor device assemblies 730, 740 include an interposer 710 between the first and second substrates 702a, 702b. In some embodiments, the first and second substrates 702a, 702b are formed as a single unitary substrate having TSVs extending from both sides (e.g., both a top side and bottom side of the substrate).

Figure 12E:
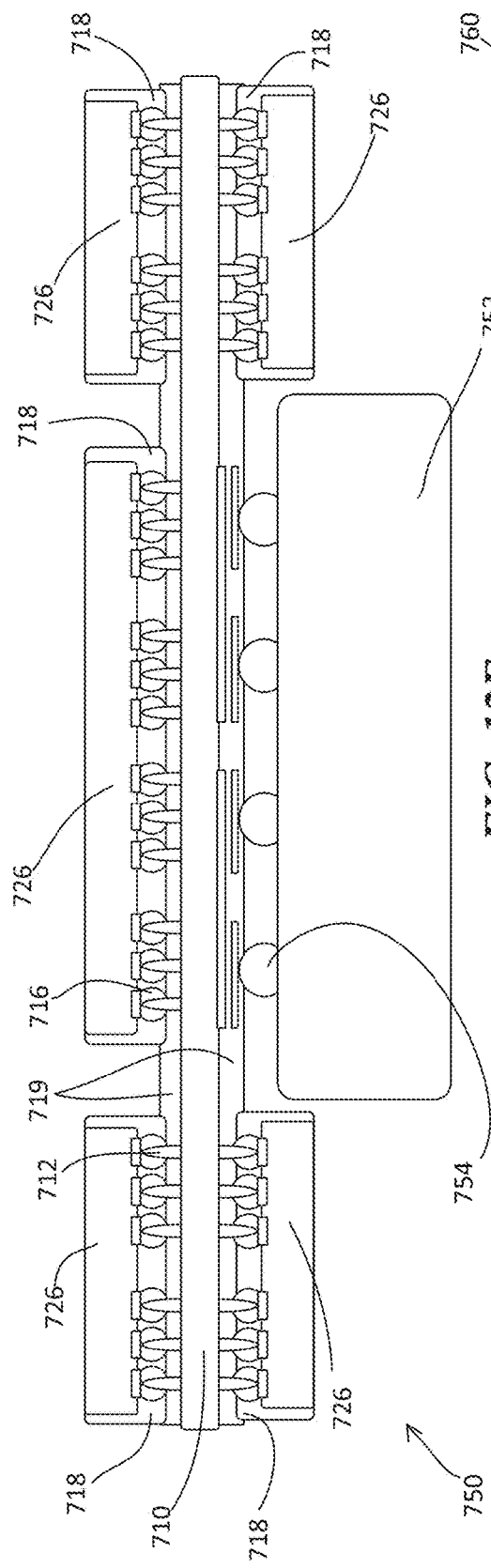
Figure 12F:
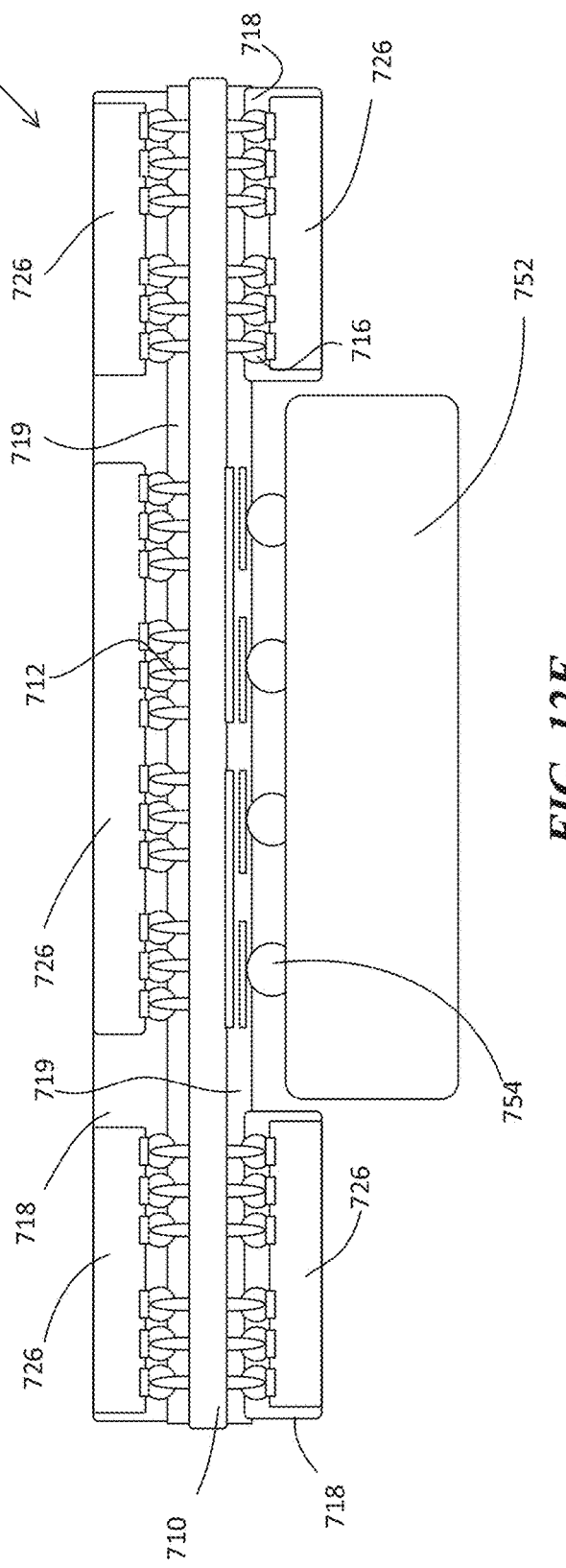

FIGS. 12E-12F illustrated embodiments of semiconductor die assemblies 750, 760, respectively. Both assemblies 750, 760 include one or more single or multichip devices 726 connected to one or both sides of an interposer 710 or substrate. The device 726 are connected to TSVs 712 extending from the interposer 710 or substrate using the above described methods of FIGS. 11A-11F. The assemblies 750, 760 can include a second substrate 752 connected to the interposer 710 or first substrate. For example, the second substrate 752 can be connected to the interposer 710 (e.g., pads 756) via standard JEDEC ball out connection having one or more solder balls 754. Other connections are also possible. The second substrate 752 can be between two or more single or multichip devices 726. In some embodiments, two or more of the single or multiple chip devices 726 are encapsulated together in a single encapsulant 718 (FIG. 12F). In some embodiments, each single or multiple chip device 726 is individually encapsulated (FIG. 12E).

Figure 13C:
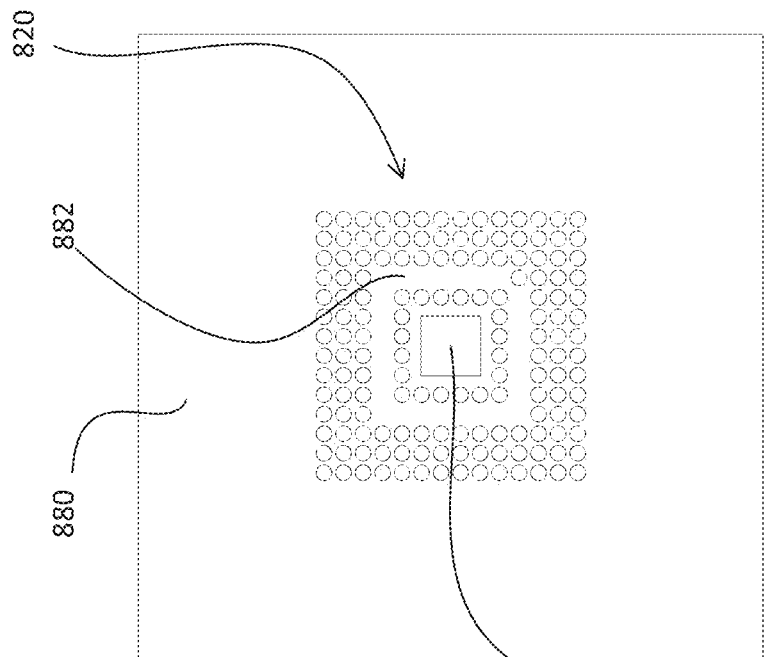
FIGS. 13C-13D are bottom plan views of semiconductor device assemblies illustrating through via distribution patterns.

In some embodiments, it may be desirable to utilize exposed vias (e.g., exposed TSVs) in a multi-chip-package (MCP). The exposed vias can provide direct connections to other packages and semiconductor devices, as described above. FIGS. 13A-13D illustrate MCPs having varying configurations of exposed vias. For example, FIG. 13A illustrates an MCP 800A having an interposer 802 or other semiconductor device. The interposer 802 can include one or more substrates 804A-D. The interposer 802 can have a first surface 808 and a second surface 810 opposite the first surface 808. The interposer 802 can include a first set of electrical contacts 812 at the first surface 808. In some embodiments, the interposer 802 includes a second set of electrical contacts 814 at the second surface 810.

To test one or more of the components of the MCP 800A, the interposer 802 can include one or more test pads 818 at one or both of the first and second surfaces 808, 810. The interposer 802 can also include one or more TSVs 820 projecting from one or both of the first and second surfaces 808, 810. The TSVs 820 can include an exposed portion 820A projecting from the second surface 810 and an embedded portion 820B extending into the substrates of the interposer 802. The TSVs 820, test pads 818, and/or contacts 814 can be operably coupled to each other via one or more interconnects 824. The interconnects 824 can extend through one or more of the substrates 804A-D. As explained above with respect to other embodiments, the exposed portions 820A of the TSVs 820 can be used for testing with probes or other testing mechanisms to confirm the functionality of one or more devices or systems within the MCP 800A.

The interposer 802 can be used to connect a first semiconductor device 844 on a first side of the interposer to a second semiconductor device 845 on an opposite side of the interposer 802. For example, the first semiconductor device 844 can include a memory stack 846 (e.g., a high bandwidth memory (HBM) stack) having a stack of dies 848 connected to each other via wirebonds, TSVs, and/or other electrical connections. The first semiconductor device 844 can be operably connected to the contacts 812 of the interposer 802 via pillar connections 850, solder ball connections, wirebonds, and/or other electrical connectors.

The second semiconductor device 845 can be, for example, a controller. The second semiconductor device 845 can include a controller die 852 (e.g., a negative-AND (NAND) controller). The controller die 852 can be operably connected to the contacts 814 of the interposer 802 via solder ball connections 854, pillar connections, wirebonds, and/or other electrical connections. One or both of the first and second semiconductor devices 844, 846 can be encapsulated in an encapsulant 860.

In some embodiments, as illustrated in FIG. 13A, the controller (e.g., the second semiconductor device 845) can be at least partially surrounded by the exposed portions 820A of the TSVs 820. The exposed portions 820A of the TSVs 820 can project beyond the lower-most elevation of the second semiconductor device 845 (e.g., in a direction normal to the second surface 810 and away from the first semiconductor device 844) for connecting the MCP 800A to other packages, devices, substrates, and/or other semiconductor devices or assemblies. The exposed portions 820A of the TSVs 820 can be connected to other semiconductor devices assemblies using, for example, the methods manufactured described above with respect to FIGS. 11A-11F. Positioning the second semiconductor device/controller 845 between the TSVs 820 can reduce the overall volume occupied by the assembled and connected system. The MCP 800A described below can function as universal flash storage (UFS) memory.

The test pads 818 on the first side 808 can be positioned around one or more sides of the first semiconductor device 844 for open access by probes or other testing devices. This provides for efficient testing of the MCPs and enables early removal of malfunctioning devices from further manufacturing. In some embodiments, the respective positions of the TSVs 820 and the test pads 818 are reversed. For example, the test pads 818 can be at the second surface 810 of the interposer 802 and the exposed portions 820A of the TSVs 820 can project from the first surface 808 of the interposer 802. FIG. 13B illustrates an example of an MCP 800B that is identical to the MCP 800A of FIG. 13A, except that the exposed portions 820A of one set of TSVs 820 (e.g., the set to the right of FIG. 13B) projects from the first surface 808 of the interposer 802 and the exposed portions 820A of another set of TSVs 820 (e.g., the set to the left of FIG. 13B) projects from the second surface 810 of the interposer 802. Similarly, one set of test pads 818 (e.g., the set to the right of FIG. 13B) is at the second surface 810 of the interposer 802 and another set of test pads 818 (e.g., the set to the left of FIG. 13B) is at the first surface 808 of the interposer 802.

Figure 13D:
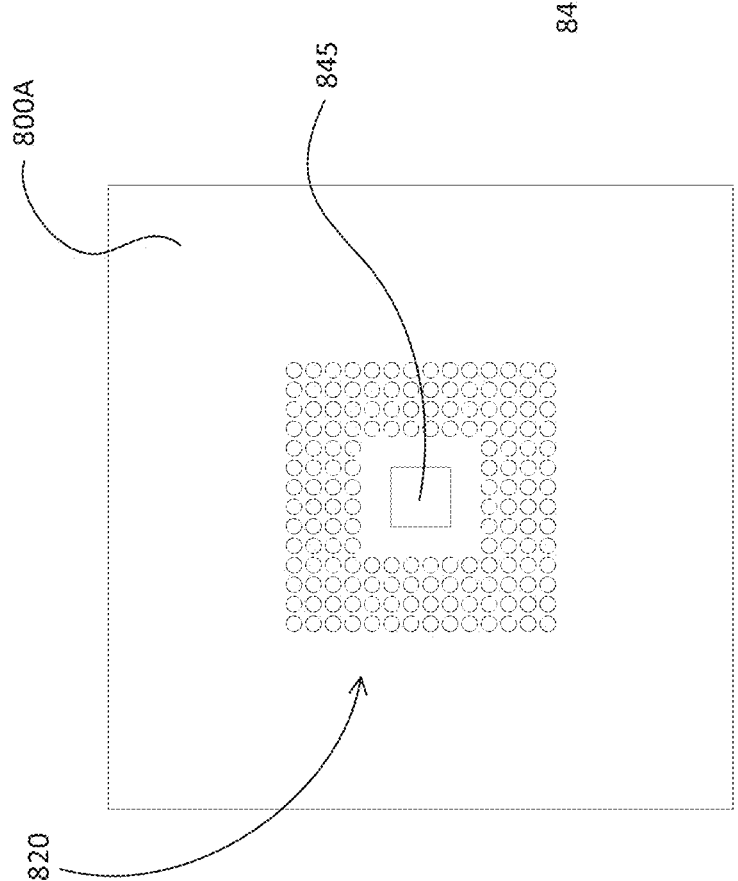

FIGS. 13C-13D illustrate alternative arrangements of the TSVs 820. For example, the TSVs 820 of the MCP 800A can be arranged in rectilinear array surrounding the second semiconductor device 845 (e.g., the controller). In some embodiments, at least some of the TSVs 820 are arranged in concentric rectangles or squares. Referring to FIG. 13D, some embodiments of the TSVs 820 can surround the semiconductor device 845 with one or more gaps 882 between rows and columns of TSVs 820. Other arrangements of TSVs 820 may also be used to operably couple the MCPs to other semiconductor devices or assemblies. For example, the array of TSVs 820 may not completely surround the second semiconductor device 845.

Figure 14:
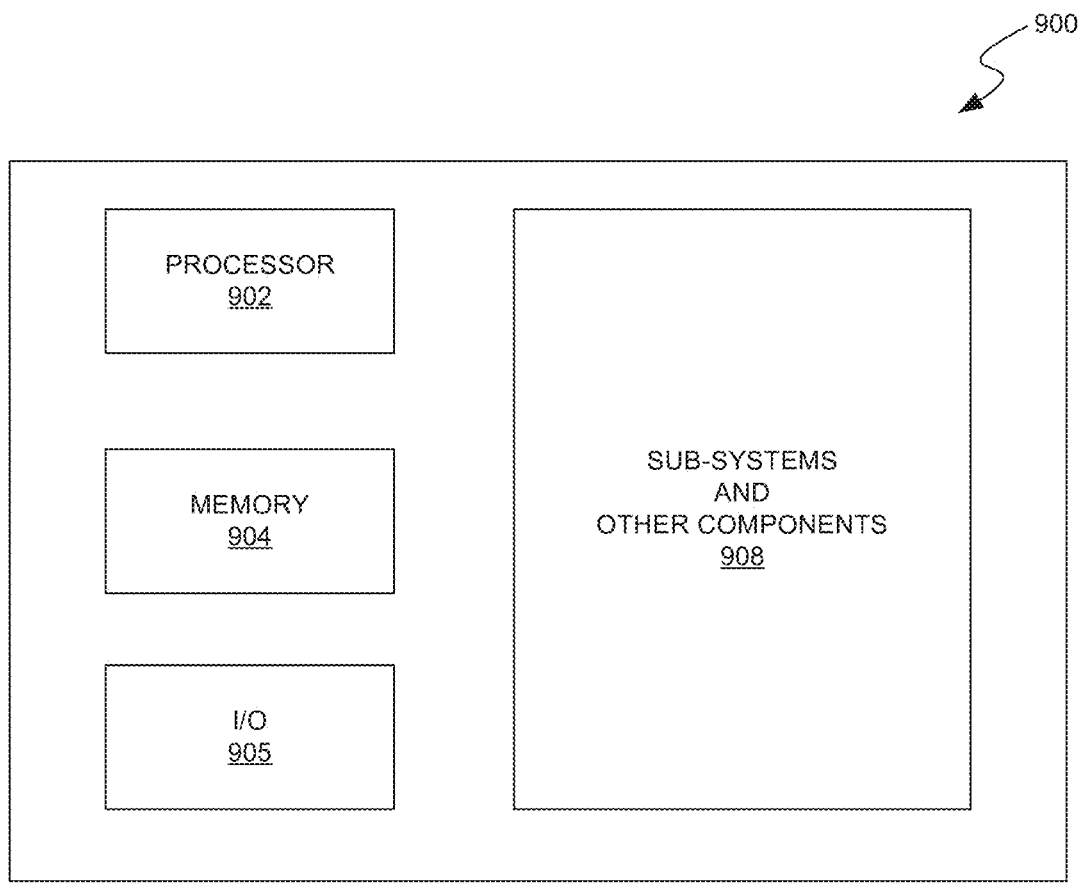
FIG. 14 is a schematic view showing a system that includes a semiconductor device assembly configured in accordance with an embodiment of the present technology.

Any one of the semiconductor device assemblies having the features described above (e.g., with reference to FIGS. 1-13D) can be incorporated into any of a myriad of larger and/or more complex systems, a representative example of which is system 900 shown schematically in FIG. 14. The system 900 can include a processor 902, a memory 904 (e.g., SRAM, DRAM, flash, and/or other memory devices), input/output devices 905, and/or other subsystems or components 908. The semiconductor dies and semiconductor die assemblies described above can be included in any of the elements shown in FIG. 14. The resulting system 900 can be configured to perform any of a wide variety of suitable computing, processing, storage, sensing, imaging, and/or other functions. Accordingly, representative examples of the system 900 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multiprocessor systems, processor-based or programmable consumer electronics, network computers, and minicomputers. Additional representative examples of the system 900 include lights, cameras, vehicles, etc. With regard to these and other examples, the system 900 can be housed in a single unit or distributed over multiple interconnected units, e.g., through a communication network. The components of the system 900 can accordingly include local and/or remote memory storage devices and any of a wide variety of suitable computer-readable media.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented in a given order, alternative embodiments may perform steps in a different order. Moreover, the various embodiments described herein may also be combined to provide further embodiments. Reference herein to "some embodiments," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment.

Certain aspects of the present technology may take the form of computer-executable instructions, including routines executed by a controller or other data processor. In some embodiments, a controller or other data processor is specifically programmed, configured, and/or constructed to perform one or more of these computer-executable instructions. Furthermore, some aspects of the present technology may take the form of data (e.g., non-transitory data) stored or distributed on computer-readable media, including magnetic or optically readable and/or removable computer discs as well as media distributed electronically over networks. Accordingly, data structures and transmissions of data particular to aspects of the present technology are encompassed within the scope of the present technology. The present technology also encompasses methods of both programming computer-readable media to perform particular steps and executing the steps.

Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms may also include the plural or singular term, respectively. Additionally, the term "comprising" is used throughout to mean including at least the recited feature(s) such that any greater number of the same feature and/or additional types of other features are not precluded. Further, while advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

What is claimed is:

1. A semiconductor device assembly comprising:
   a first semiconductor device comprising a die stack and electrical connectors projecting from the die stack;
   an interposer comprising:
   a substrate having a first surface facing the first semiconductor device and a second surface opposite the first surface;
   through vias in which individual vias include an exposed portion and an embedded portion, the exposed portions projecting from one or both of the first surface and the second surface of the substrate, and the embedded portions extending through at least a portion of the substrate between the first surface and the second surface;
   one or more test pads at one or both of the first surface and the second surface of the substrate;
   a first electrical contact at the first surface of the substrate and operably coupled to the first semiconductor device via the electrical connectors; and
   a second electrical contact at the second surface of the substrate; and
   a controller positioned on an opposite side of the interposer from the first semiconductor device and operably coupled to the interposer via connection to the second electrical contact,
   wherein the substrate of the interposer includes one or more interconnects configured to operably connect the through vias to the first electrical contact and to the second electrical contact.

2. The semiconductor device assembly of claim 1, wherein the through vias at least partially surround the controller in a plane parallel to the second surface of the substrate of the interposer.

3. The semiconductor device assembly of claim 1, wherein the controller is a NAND controller.

4. The semiconductor device assembly of claim 1, wherein the first semiconductor device is a memory stack.

5. The semiconductor device assembly of claim 1, wherein the one or more test pads are at the first surface of the substrate and at least partially surround the die stack.

6. The semiconductor device assembly of claim 1, wherein the one or more test pads are configured to facilitate testing of the operability of portions of the semiconductor device assembly using tools separate from the semiconductor device assembly.

7. The semiconductor device assembly of claim 1, wherein one or both of the first semiconductor device and the controller are encapsulated in an encapsulant.

8. A semiconductor device assembly comprising:
   a first semiconductor device comprising a die stack and electrical connectors projecting from the die stack;
   an interposer comprising:
   a substrate having a first surface facing the first semiconductor device and a second surface opposite the first surface;
   through vias in which individual vias include an exposed portion and an embedded portion, the exposed portions projecting from one or both of the first surface and the second surface of the substrate, and the embedded portions extending through at least a portion of the substrate between the first surface and the second surface;
   one or more test pads at one or both of the first surface and the second surface of the substrate;
   a first electrical contact at the first surface of the substrate and operably coupled to the first semiconductor device via the electrical connectors; and
   a second electrical contact at the second surface of the substrate; and a controller positioned on an opposite side of the interposer from the first semiconductor device and operably coupled to the interposer via connection to the second electrical contact,
wherein the through vias extend past the controller in a direction normal to the second surface of the substrate and away from the first semiconductor device.

9. A semiconductor device assembly comprising:
a memory stack of dies;
a substrate comprising:
   a first side facing the memory stack of dies;
   a second side opposite the memory stack of dies;
   a first set of contacts at the first side of the substrate;
   a second set of contacts at the second side of the substrate;
   a first test pad at the first side;
   a second test pad at the first side of the substrate and on an opposite side of the memory stack of dies from the first test pad;
   a first exposed through via projecting from the second side of the substrate and extending through at least a portion of the substrate between the first side and the second side; and
   a second exposed through via projecting from the second side of the substrate and extending through at least a portion of the substrate between the first side and the second side; and
a controller operably connected to the second side of the substrate and between the first exposed through via and the second exposed through via.

10. The semiconductor device assembly of claim 9, wherein the first and second exposed through vias extend beyond the controller in a direction normal to the second side of the substrate and away from the memory stack of dies.

11. The semiconductor device assembly of claim 9, further comprising at least one interconnect in the substrate connecting the first set of contacts to the second set of contacts, and connecting the first set of contacts to the first and second exposed through vias.

12. The semiconductor device assembly of claim 9, further comprising exposed through vias projecting from the first side of the substrate.

13. The semiconductor device assembly of claim 9, further comprising through vias projecting from the second side of the substrate and arranged in concentric patterns.

14. The semiconductor device assembly of claim 13, wherein the concentric patterns are concentric squares.

15. The semiconductor device assembly of claim 9, wherein one or both of the memory stack of dies and the controller are encapsulated in an encapsulant.

* * * * *